(12) United States Patent
Nozawa

(10) Patent No.: US 11,292,248 B2
(45) Date of Patent: Apr. 5, 2022

(54) LIQUID EJECTION APPARATUS AND CIRCUIT BOARD

(71) Applicant: Seiko Epson Corporation, Tokyo (JP)

(72) Inventor: Dai Nozawa, Matsumoto (JP)

(73) Assignee: Seiko Epson Corporation

( * ) Notice: Subject to any disclaimer, the term of this patent is extended or adjusted under 35 U.S.C. 154(b) by 0 days.

(21) Appl. No.: 17/005,412

(22) Filed: Aug. 28, 2020

(65) Prior Publication Data

US 2021/0060930 A1 Mar. 4, 2021

(30) Foreign Application Priority Data

Aug. 29, 2019 (JP) .............................. JP2019-157092

(51) Int. Cl.
*B41J 2/045* (2006.01)
*H03F 1/02* (2006.01)

(52) U.S. Cl.
CPC ......... *B41J 2/04541* (2013.01); *B41J 2/0455* (2013.01); *B41J 2/04588* (2013.01); *H03F 1/0222* (2013.01)

(58) Field of Classification Search
CPC ... B41J 2/04541; B41J 2/0455; B41J 2/04581
See application file for complete search history.

(56) References Cited

U.S. PATENT DOCUMENTS

| | | | | |
|---|---|---|---|---|
| 2014/0285579 | A1* | 9/2014 | Oshima | B41J 2/04581 347/50 |
| 2015/0273821 | A1* | 10/2015 | Abe | B41J 2/04596 347/10 |
| 2016/0046119 | A1* | 2/2016 | Kashimura | B41J 2/04588 347/10 |
| 2016/0046122 | A1* | 2/2016 | Takagi | B41J 2/04541 347/9 |
| 2016/0339690 | A1* | 11/2016 | Matsumoto | B41J 2/04541 |
| 2017/0001435 | A1 | 1/2017 | Nozawa | |
| 2018/0178510 | A1* | 6/2018 | Nakajima | B41J 29/377 |

FOREIGN PATENT DOCUMENTS

JP 2017-013362 A 1/2017

* cited by examiner

*Primary Examiner* — Lam S Nguyen
(74) *Attorney, Agent, or Firm* — Harness, Dickey & Pierce, P.L.C.

(57) ABSTRACT

A liquid ejection apparatus includes a liquid ejection head that ejects a liquid by driving a drive element, a drive signal output circuit that outputs a drive signal for driving the drive element, and a substrate provided with the drive signal output circuit, wherein the drive signal output circuit includes a modulation circuit that modulates an original drive signal to output a modulation signal, an amplifier circuit that amplifies the modulation signal to output an amplified modulation signal, and a demodulation circuit that demodulates the amplified modulation signal to output the drive signal for driving the drive element, and wherein the demodulation circuit is located, on the substrate, between the modulation circuit and the amplifier circuit.

8 Claims, 17 Drawing Sheets

| [SIH, SIL] | | [1, 1]<br>LARGE DOT | [1, 0]<br>MEDIUM DOT | [0, 1]<br>SMALL DOT | [0, 0]<br>NO DOTS RECORDED |
|---|---|---|---|---|---|
| S1 | T1 | H | H | H | L |
| | T2 | H | L | L | L |
| S2 | T1 | L | L | L | H |
| | T2 | L | H | L | L |

LIQUID EJECTION APPARATUS AND CIRCUIT BOARD

The present application is based on, and claims priority from JP Application Serial Number 2019-157092, filed Aug. 29, 2019, the disclosure of which is hereby incorporated by reference herein in its entirety.

BACKGROUND

1. Technical Field

The present disclosure relates to a liquid ejection apparatus and a circuit board.

2. Related Art

An ink jet printer that prints an image or a document on a medium by ejecting ink as a liquid is known in which a piezoelectric element such as a piezo element is used. The piezoelectric element is provided corresponding to each of the plurality of nozzles in the head unit. A predetermined amount of ink is ejected from the corresponding nozzle at a predetermined timing by driving each of the piezoelectric elements in accordance with the drive signal. As a result, dots are formed on the medium. Such a piezoelectric element is electrically a capacitive load, such as a capacitor, and therefore, it is necessary to supply a sufficient current to operate the piezoelectric element corresponding to each nozzle.

In order to supply a sufficient current for operating the piezoelectric element, as a drive circuit, an amplifier circuit that amplifies the supplied original signal to output the amplified signal as a drive signal is used. Such an amplifier circuit may be a class A amplifier circuit, a class B amplifier circuit, a class AB amplifier circuit, or the like, but from the viewpoint of power consumption reduction, in some cases, the class A amplifier circuit, the class B amplifier circuit, and a class D amplifier circuit that is superior in energy conversion efficiency to the class AB amplifier circuit are used.

For example, JP-A-2017-013362 discloses a liquid ejection apparatus including a class D amplifier circuit as a drive circuit that generates a drive signal for driving a piezoelectric element.

The class D amplifier circuit described in JP-A-2017-013362 converts an original signal into an analog signal, and generates a modulation signal by performing a pulse width modulation or a pulse density modulation on the converted analog signal. According to the generated modulation signal, a transistor pair inserted in series between the power supply potential and the ground potential switches to generate an amplified modulation signal to generate and output a drive signal whose original signal is amplified by demodulating the amplified modulation signal with a demodulation circuit including an inductor such as a coil and a capacitor such as a capacitor.

However, in the class D amplifier circuit described in JP-A-2017-013362, with the switching operation of the transistor pair, a large current may flow through the transistor pair, and a switching noise caused by the switching operation may generate. Such a switching noise is caused by a large current flowing through the transistor pair. When such a switching noise is superimposed on the circuit elements constituting the class D amplifier circuit, the waveform accuracy of the signal output from the class D amplifier circuit may be reduced. That is, the class D amplifier circuit described in JP-A-2017-013362 has room for improvement from the viewpoint of improving the waveform accuracy of the output drive signal.

SUMMARY

According to an aspect of the present disclosure, a liquid ejection apparatus includes a liquid ejection head including a drive element, where the liquid ejection head ejects a liquid by driving the drive element, a drive signal output circuit that outputs a drive signal for driving the drive element, and a substrate provided with the drive signal output circuit, wherein the drive signal output circuit includes a modulation circuit that modulates an original drive signal to output a modulation signal, an amplifier circuit that amplifies the modulation signal to output an amplified modulation signal, and a demodulation circuit that demodulates the amplified modulation signal to output the drive signal for driving the drive element, and wherein the demodulation circuit is located, on the substrate, between the modulation circuit and the amplifier circuit.

According to an aspect of the present disclosure, in the liquid ejection apparatus, the amplifier circuit may include a first input terminal to which a power supply voltage is input, and a second input terminal to which a reference voltage is input, wherein the drive signal output circuit may include a capacitive element having one end electrically coupled to the first input terminal and the other end electrically coupled to the second input terminal, and wherein the amplifier circuit may be located between the demodulation circuit and the capacitive element.

According to an aspect of the present disclosure, in the liquid ejection apparatus, the first input terminal, the second input terminal, and the capacitive element may be provided on a same surface of the substrate, wherein the first input terminal and the one end of the capacitive element may be electrically coupled to each other through first wiring provided on the surface, and wherein the second input terminal and the other end of the capacitive element may be electrically coupled to each other through second wiring provided on the surface.

According to an aspect of the present disclosure, in the liquid ejection apparatus, the amplifier circuit may include a first transistor electrically coupled to the first input terminal and a second transistor electrically coupled to the second input terminal.

According to an aspect of the present disclosure, in the liquid ejection apparatus, the first transistor may be housed in a first housing having a first side provided with the first input terminal and a second side facing the first side, and wherein a distance between the first side and the capacitive element may be shorter than a distance between the second side and the capacitive element.

According to an aspect of the present disclosure, in the liquid ejection apparatus, the second transistor may be housed in a second housing including a third side provided with the second input terminal and a fourth side facing the third side, and wherein a distance between the third side and the capacitive element may be shorter than a distance between the fourth side and the capacitive element.

According to an aspect of the present disclosure, in the liquid ejection apparatus, the first transistor and the second transistor may be housed in a third housing including a fifth side provided with the first input terminal and the second input terminal and a sixth side facing the fifth side, and wherein a distance between the fifth side and the capacitive element may be shorter than a distance between the sixth side and the capacitive element.

According to an aspect of the present disclosure, a circuit board includes a modulation circuit that modulates an original drive signal to output a modulation signal, an amplifier circuit that amplifies the modulation signal to output an amplified modulation signal, a demodulation circuit that demodulates the amplified modulation signal to outputs a drive signal for driving a drive element, and a substrate provided with the modulation circuit, the amplifier circuit, and the demodulation circuit, wherein the demodulation circuit is located, on the substrate, between the modulation circuit and the amplifier circuit.

DESCRIPTION OF EXEMPLARY EMBODIMENTS

Hereinafter, preferred embodiments of the present disclosure will be described with reference to the drawings. The drawings used are for convenience of explanation. The embodiments described below do not unduly limit the details of the present disclosure described in the claims. In addition, all of the configurations described below are not necessarily essential components of the disclosure.

1. First Embodiment 1.1 Configuration of Liquid Ejection Apparatus

Figure 1:
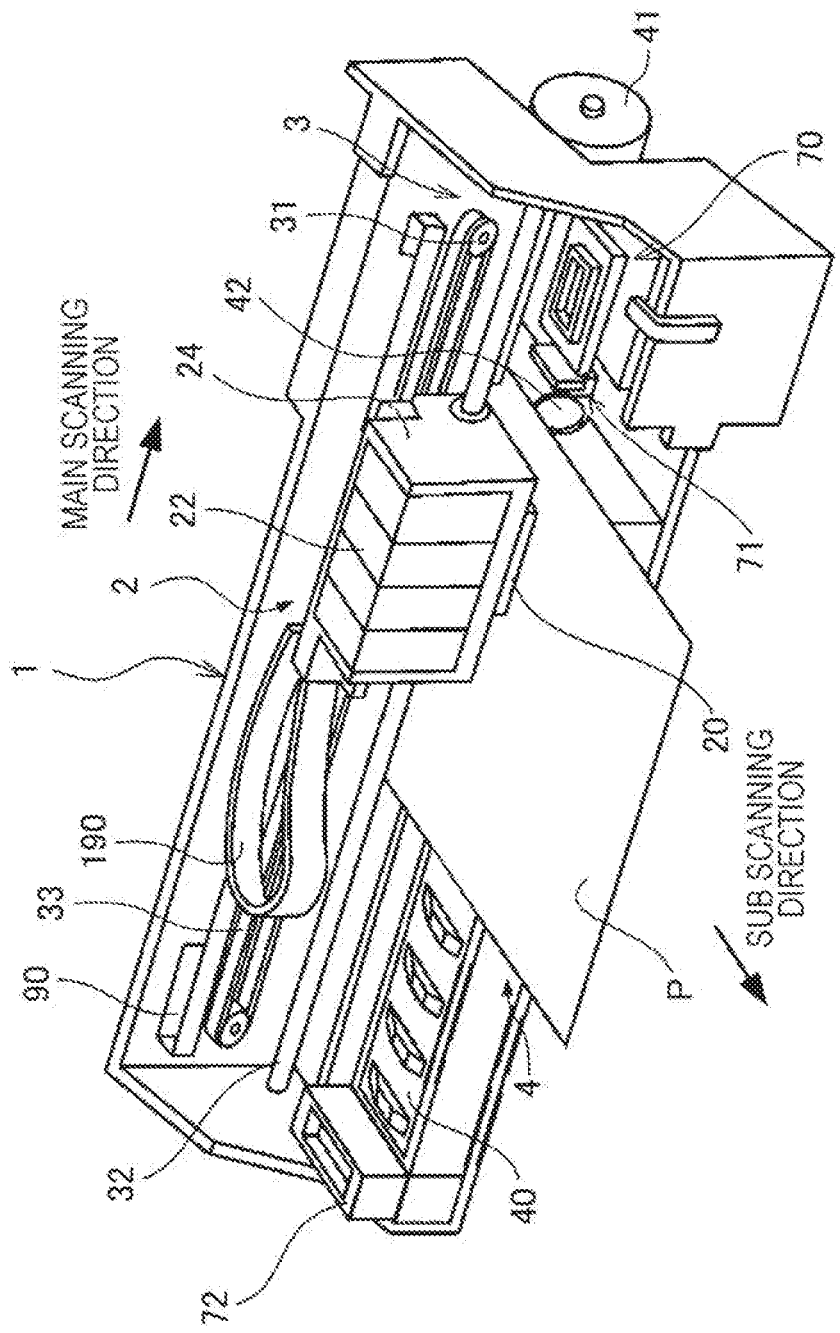
FIG. 1 is a diagram illustrating a schematic configuration of the inside of a liquid ejection apparatus.

FIG. 1 is a diagram illustrating a schematic configuration of the inside of a liquid ejection apparatus 1 according to the first embodiment. The liquid ejection apparatus 1 is an ink jet printer in which ink as a liquid is ejected in accordance with image data supplied from a host computer provided outside to form dots on a medium P such as paper, thereby printing an image according to the supplied image data. In FIG. 1, some of the components of the liquid ejection apparatus 1 such as an enclosure and a cover are not shown.

As shown in FIG. 1, the liquid ejection apparatus 1 includes a movement mechanism 3 that moves a head unit 2 in the main scanning direction. The movement mechanism 3 includes a carriage motor 31 serving as the driving source of the head unit 2, a carriage guide shaft 32 having both ends fixed, a timing belt 33 extending substantially parallel to the carriage guide shaft 32 and driven by the carriage motor 31. The movement mechanism 3 includes a linear encoder 90 that detects the position of the head unit 2 in the main scanning direction.

A carriage 24 of the head unit 2 is configured so that a predetermined number of ink cartridges 22 can be mounted thereon. The carriage 24 is reciprocably supported by the carriage guide shaft 32 and is fixed to a portion of the timing belt 33. Accordingly, the carriage 24 of the head unit 2 is guided by the carriage guide shaft 32 and reciprocates when the carriage motor 31 causes the timing belt 33 to travel forward and backward. That is, the carriage motor 31 moves the carriage 24 in the main scanning direction. A head 20 is attached to a portion, of the carriage 24, facing the medium P. As will be described later, the head 20 includes a large number of nozzles, and ejects a predetermined amount of ink from each nozzle at a predetermined timing. Various control signals are supplied to the head unit 2 operating as described above via a flexible flat cable 190.

The liquid ejection apparatus 1 includes a transport mechanism 4 that transports the medium P in the sub scanning direction. The transport mechanism 4 includes a platen 40 that supports the medium P, a transport motor 41 that is a driving source, and a transport roller 42 that is rotated by the transport motor 41 and transports the medium P in the sub scanning direction. In a state where the medium P is supported by the platen 40, the ink is ejected from the head 20 onto the medium P according to the timing at which the medium P is transported by the transport mechanism 4, so that a desired image is formed at the surface of the medium P.

A home position serving as a base point of the head unit 2 is set in an end region within the movement range of the carriage 24 included in the head unit 2. A capping member 70 that seals the nozzle formation face of the head and a wiper member 71 that wipes the nozzle formation face are disposed at the home position. The liquid ejection apparatus 1 forms an image at the surface of the medium P bidirectionally when the carriage 24 moves forward toward the end opposite the home position, and when the carriage 24 moves backward from the opposite end toward the home position.

A flushing box 72 that collects the ink ejected from the head 20 during a flushing operation is provided at the end of the platen 40 in the main scanning direction, and at the end opposite the home position from which the carriage 24 moves. The flushing operation is an operation of forcibly ejecting the ink from each nozzle regardless of the image data in order to prevent the possibility that the proper amount of ink will not be ejected due to nozzle clogging due to thickening of the ink near the nozzle, air bubbles mixed into the nozzle, and the like. Note that the flushing boxes 72 may be provided on both sides of the platen 40 in the main scanning direction.

1.2 Electrical Configuration of Liquid Ejection Apparatus

Figure 2:
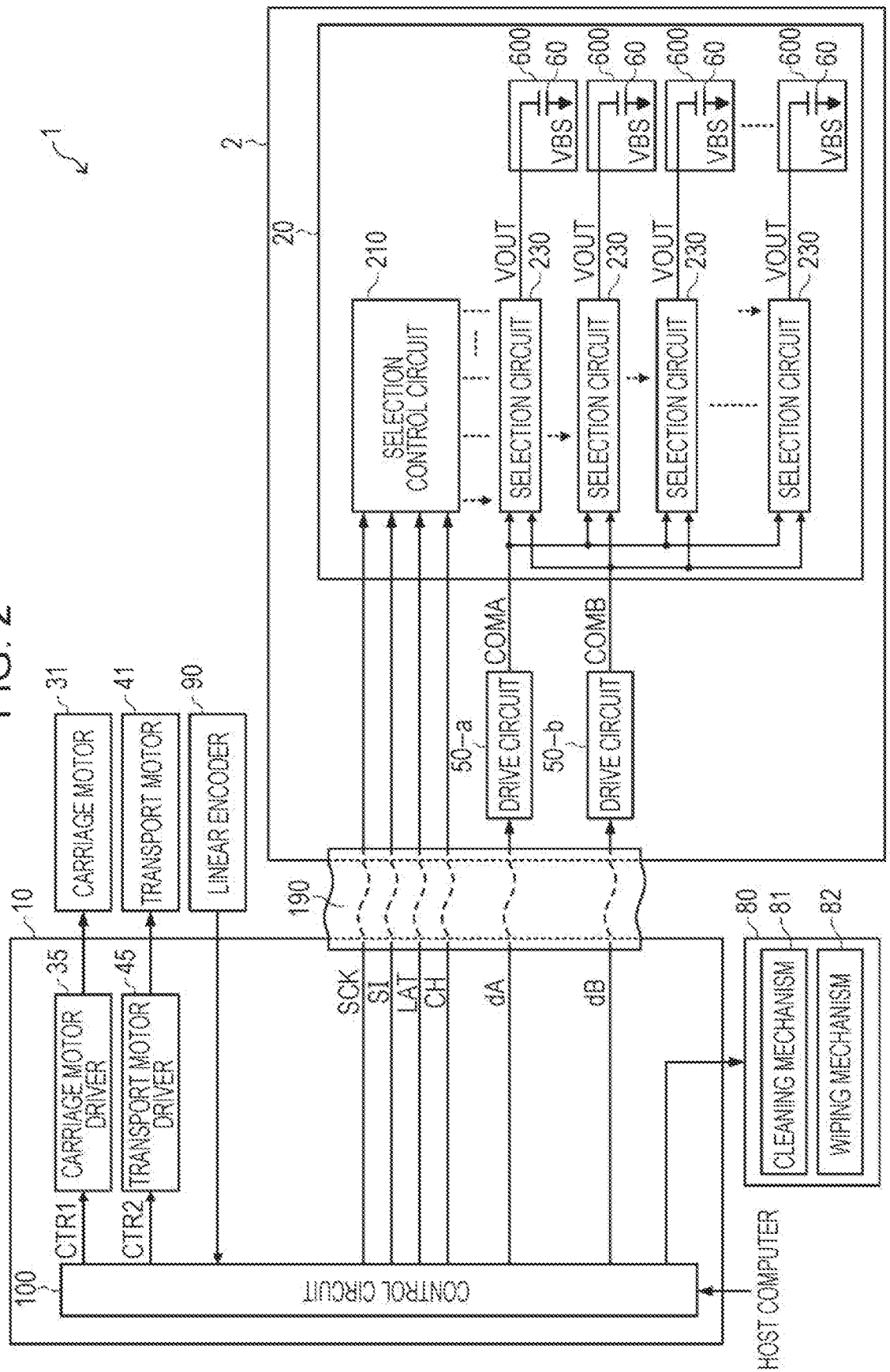
FIG. 2 is a diagram illustrating an electrical configuration of a liquid ejection apparatus.

FIG. 2 is a diagram illustrating an electrical configuration of the liquid ejection apparatus 1. As shown in FIG. 2, the liquid ejection apparatus 1 includes a control unit 10 and the head unit 2. The control unit 10 and the head unit 2 are electrically coupled to each other via the flexible flat cable 190.

The control unit 10 includes a control circuit 100, a carriage motor driver 35, and a transport motor driver 45. The control circuit 100 generates a control signal corresponding to the image data supplied from the host computer to output the control signal to a corresponding configuration.

Specifically, the control circuit 100 grasps the current scanning position of the head unit 2 based on the detection signal of the linear encoder 90. The control circuit 100 generates control signals CTR1 and CTR2 corresponding to the current scanning position of the head unit 2. The control signal CTR1 is supplied to the carriage motor driver 35. The carriage motor driver 35 drives the carriage motor 31 according to the input control signal CTR1. Further, the control signal CTR2 is supplied to the transport motor driver 45. The transport motor driver 45 drives the transport motor 41 according to the input control signal CTR2. As a result, the movement of the carriage 24 in the main scanning direction and the transport of the medium P in the sub scanning direction are controlled.

In addition, the control circuit 100 generates, based on image data supplied from an externally provided host computer and a detection signal of the linear encoder 90, a clock signal SCK, a print data signal SI, a latch signal LAT, a change signal CH, and original drive signals dA and dB corresponding to the current scanning position of the head unit 2 to output the signals to head unit 2.

Further, the control circuit 100 causes a maintenance unit 80 to perform a maintenance process of restoring the ink ejection state of an ejection unit 600 to a normal state. The maintenance unit 80 includes a cleaning mechanism 81 and a wiping mechanism 82. The cleaning mechanism 81 performs, as a maintenance process, a pumping process of sucking the thickened ink, bubbles, and the like stored in the ejection unit 600 by a tube pump (not shown). Further, the wiping mechanism 82 performs, as a maintenance process, a wiping process of wiping foreign matter such as paper dust attached to the vicinity of the nozzle of the ejection unit 600 with the wiper member 71. The control circuit 100 may perform the above-described flushing operation as a maintenance process of restoring the ink ejection state of the ejection unit 600 to a normal state.

The head unit 2 includes drive circuits 50-$a$ and 50-$b$ and the head 20.

The drive circuit 50-$a$ receives the digital original drive signal dA. The drive circuit 50-$a$ generates the drive signal COMA by digital-to-analog converting the input original drive signal dA to class-D amplify the converted analog signal to outputs the generated drive signal COMA to the head 20. Similarly, the drive circuit 50-$b$ receives the digital original drive signal dB. The drive circuit 50-$b$ generates the drive signal COMB by digital-to-analog converting the input original drive signal dB to class-D amplify the converted analog signal to output the generated drive signal COMB to the head 20.

That is, the original drive signal dA defines the waveform of the drive signal COMA, and the original drive signal dB defines the waveform of the drive signal COMB. Therefore, the original drive signals dA and dB may be signals that can define the waveforms of the drive signals COMA and COMB, and may be, for example, analog signals. The details of the drive circuits 50-$a$ and 50-$b$ will be described later. Further, in the description of FIG. 2, the drive circuits 50-$a$ and 50-$b$ are included in the head unit 2, but each of the drive circuits 50-$a$ and 50-$b$ may be included in the control unit 10. In this case, the drive signals COMA and COMB output from the drive circuits 50-$a$ and 50-$b$ respectively are supplied to the head 20 of the head unit 2 via the flexible flat cable 190.

The head 20 includes a selection control circuit 210, a plurality of selection circuits 230, and a plurality of ejection units 600 corresponding to the plurality of respective selection circuits 230. The selection control circuit 210 generates, based on the clock signal SCK, the print data signal SI, the latch signal LAT, and the change signal CH supplied from the control circuit 100, a selection signal for selecting or deselecting the waveforms of the drive signals COMA and COMB to output the to each of selection signal to each of the plurality of selection circuits 230.

Each selection circuit 230 receives the drive signals COMA and COMB and the selection signal output from the selection control circuit 210. The selection circuit 230 generates a drive signal VOUT based on the drive signals COMA and COMB by selecting or deselecting the waveforms of the drive signals COMA and COMB based on the input selection signal to output the generated drive signal VOUT to the corresponding ejection unit 600.

Each ejection unit 600 includes a piezoelectric element 60. The drive signal VOUT output from the corresponding selection circuit 230 is supplied to one end of the piezoelectric element 60. Further, a reference voltage signal VBS is applied to the other end of the piezoelectric element 60. The piezoelectric element 60 included in the ejection unit 600 is driven according to a potential difference between the drive signal VOUT supplied to the one end and the reference voltage signal VBS supplied to the other end. An amount of ink corresponding to the driving of the piezoelectric element 60 is ejected from the ejection unit 600.

Here, the drive circuit 50-$a$ that outputs the drive signal COMA is an example of a drive signal output circuit, and the drive circuit 50-$b$ that outputs the drive signal COMB is another example of the drive signal output circuit. Therefore, the drive signal COMA is an example of the drive signal, and the drive signal COMB is another example of the drive signal. The drive signal VOUT generated by selecting the waveforms of the drive signals COMA and COMB is also an example of the drive signal. The piezoelectric element 60 driven by the supply of the drive signal VOUT is an example of the drive element. The head 20 including the piezoelectric element 60 and ejecting the liquid by driving the piezoelectric element 60 is an example of a liquid ejection head.

1.3 Configuration of Ejection Unit

Figure 3:
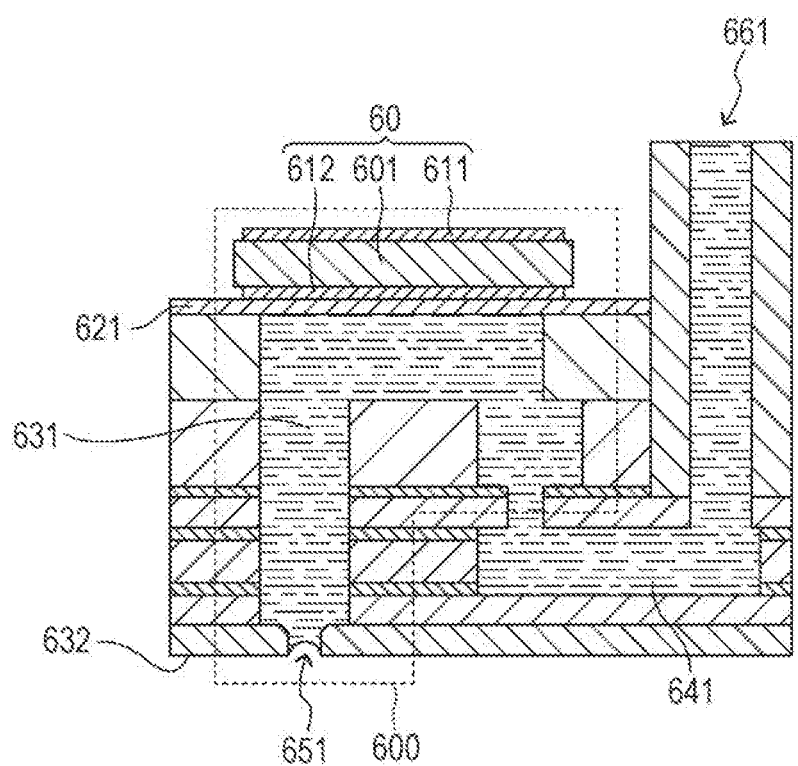
FIG. 3 is a diagram illustrating a schematic configuration of one of a plurality of ejection units included in a head.

FIG. 3 is a diagram illustrating a schematic configuration of one of the plurality of ejection units 600 included in the head 20. As shown in FIG. 3, the ejection unit 600 includes the piezoelectric element 60, a vibration plate 621, a cavity 631, and a nozzle 651.

The cavity 631 is filled with the ink supplied from a reservoir 641. Further, the ink is introduced into the reservoir 641 from the ink cartridge 22 via an ink tube (not shown) and a supply port 661. That is, the cavity 631 is filled with the ink stored in the corresponding ink cartridge 22.

The vibration plate 621 is displaced by driving the piezoelectric element 60 provided on the upper face in FIG. 3. With the displacement of the vibration plate 621, the internal volume of the cavity 631 filled with the ink expands or contracts. That is, the vibration plate 621 functions as a diaphragm that changes the internal volume of the cavity 631.

The nozzle 651 is an opening provided in the nozzle plate 632 and communicating with the cavity 631. When the internal volume of the cavity 631 changes, an amount of ink corresponding to the change in the internal volume is ejected from the nozzle 651.

The piezoelectric element 60 has a structure in which a piezoelectric body 601 is pinched between a pair of electrodes 611 and 612. In the piezoelectric body 601 having such a structure, the central portion of the electrodes 611 and 612 bends in the vertical direction together with the vibration plate 621 according to the potential difference between the voltages applied by the electrodes 611 and 612. Specifically, the piezoelectric element 60 bends upward when the voltage level of the drive signal VOUT increases, and bends downward when the voltage level of the drive signal VOUT decreases.

In the ejection unit 600 configured as described above, the vibration plate 621 is displaced by the piezoelectric element 60 bending upward to increase the internal volume of the cavity 631. As a result, the ink is drawn from the reservoir 641. On the other hand, when the piezoelectric element 60 bends downward, the vibration plate 621 is displaced to reduce the internal volume of the cavity 631. As a result, an amount of ink corresponding to the degree of reduction is ejected from the nozzle 651.

The piezoelectric element 60 is not limited to the structure shown in FIG. 3, and the ejection unit 600 may have a configuration in which the ink can be ejected by driving the piezoelectric element 60. Therefore, the piezoelectric element 60 is not limited to the above-described configuration of the bending vibration, but may be, for example, a configuration using the longitudinal vibration.

1.4 Head Configuration

Next, the configuration and the operation of the head 20 will be described. As described above, the head 20 generates the drive signal VOUT by selecting or deselecting the drive signals COMA and COMB output from the drive circuits 50-a and 50-b based on the clock signal SCK, the print data signal SI, the latch signal LAT, and the change signal CH to supply the generated drive signal VOUT to the corresponding ejection unit 600. Therefore, in describing the configuration and the operation of the head 20, first, an example of the waveforms of the drive signals COMA and COMB and an example of the waveform of the drive signal VOUT will be described.

Figure 4:
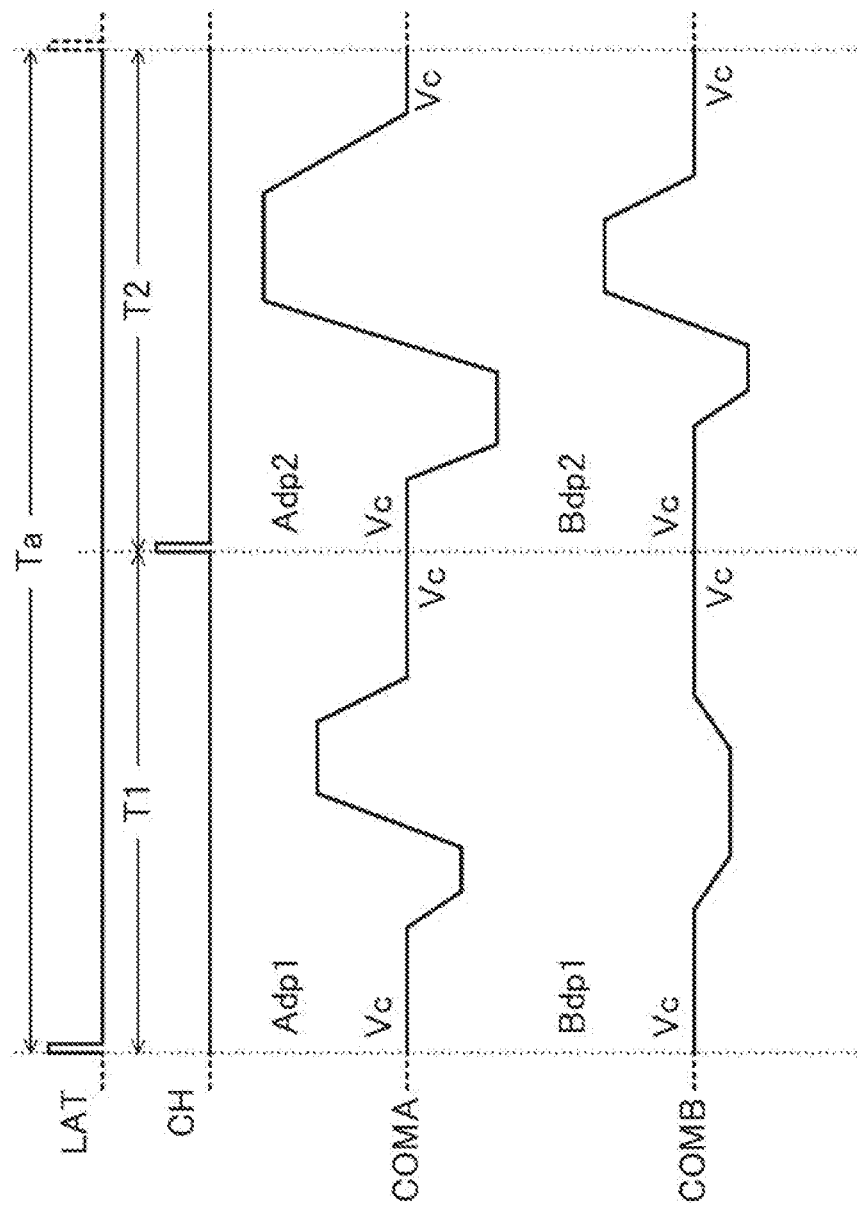
FIG. 4 is a diagram illustrating an example of waveforms of drive signals COMA and COMB.

FIG. 4 is a diagram illustrating an example of the waveforms of the drive signals COMA and COMB. As shown in FIG. 4, the drive signal COMA includes a waveform in which a trapezoidal waveform Adp1 disposed in a period T1 from the rise of the latch signal LAT to the rise of the change signal CH, and a trapezoidal waveform Adp2 disposed in a period T2 from the rise of the change signal CH to the rise of the latch signal LAT are continuous. The trapezoidal waveform Adp1 is a waveform for ejecting a small amount of ink from the nozzle 651, and the trapezoidal waveform Adp2 is a waveform for ejecting a medium amount of ink that is larger than the small amount from the nozzle 651.

Further, the drive signal COMB includes a waveform in which a trapezoidal waveform Bdp1 disposed in the period T1 and a trapezoidal waveform Bdp2 disposed in the period T2 are continuous. The trapezoidal waveform Bdp1 is a waveform for causing the ink not to be ejected from the nozzle 651, and is a waveform for preventing an increase in ink viscosity by slightly vibrating the ink near the opening of the nozzle 651. Further, as in the trapezoidal waveform Adp1, the trapezoidal waveform Bdp2 is a waveform for ejecting a small amount of ink from the nozzles 651.

The voltages at the start timing and the end timing of each of the trapezoidal waveforms Adp1, Adp2, Bdp1, and Bdp2 are commonly a voltage Vc. That is, each of the trapezoidal waveforms Adp1, Adp2, Bdp1, and Bdp2 is a waveform that starts at the voltage Vc and ends at the voltage Vc. A cycle Ta including the period T1 and the period T2 corresponds to a printing cycle for forming dots on the medium P.

Here, in FIG. 4, the trapezoidal waveform Adp1 and the trapezoidal waveform Bdp2 are identical, but the trapezoidal waveform Adp1 and the trapezoidal waveform Bdp2 may be different. Further, the description is made assuming that a small amount of ink is ejected from the corresponding nozzle when the trapezoidal waveform Adp1 is supplied to an ejection head 21, and when the trapezoidal waveform Bdp1 is supplied to the ejection head 21, but different amounts of ink may be ejected. That is, the waveforms of the drive signals COMA and COMB are not limited to the waveforms shown in FIG. 4, various waveforms may be combined depending on the moving speed of the carriage 24 to which the head 20 is attached, the nature of the ink stored in the ink cartridge 22, the material of the medium P, and the like.

Figure 5:
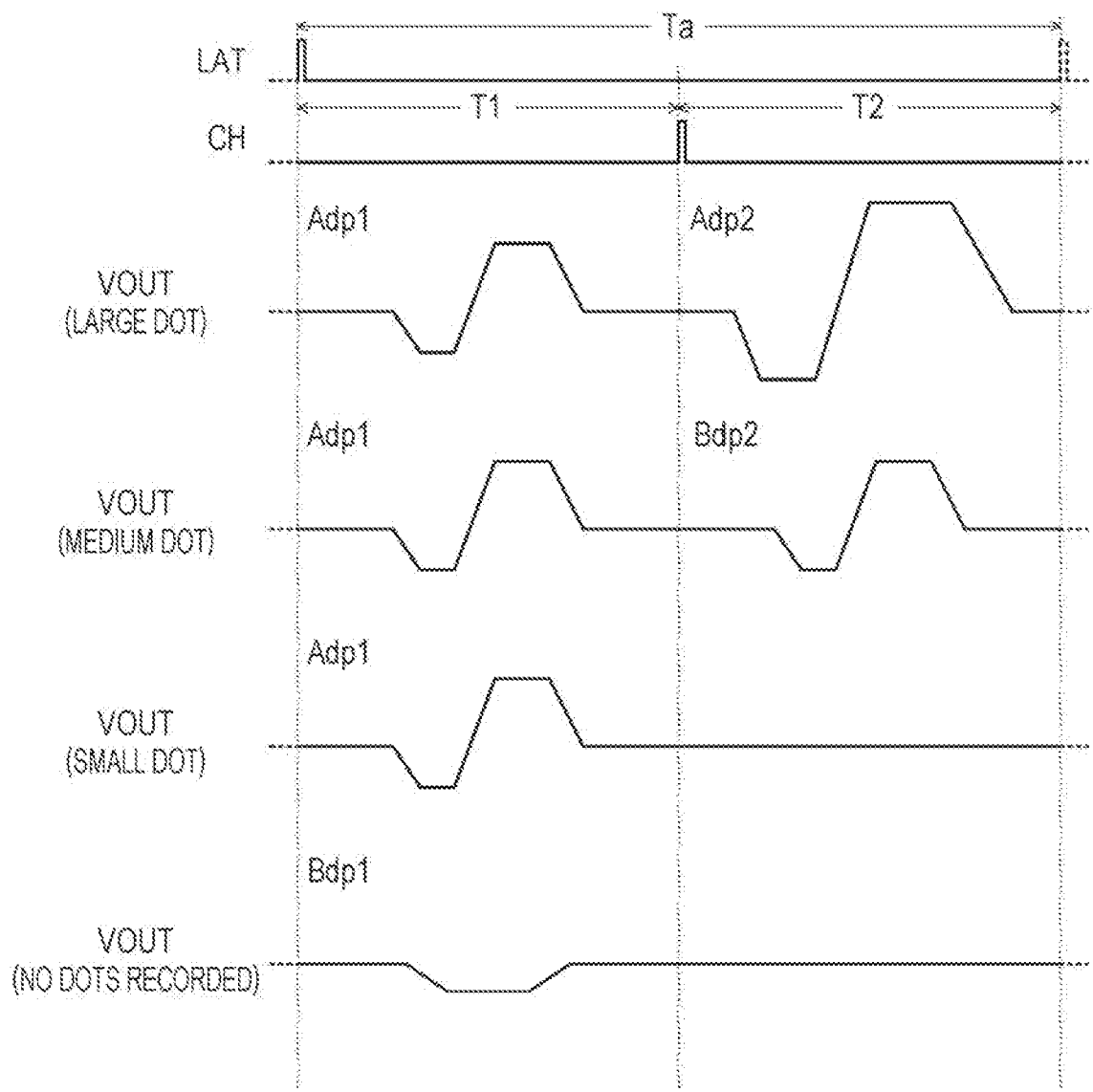
FIG. 5 is a diagram illustrating an example of waveforms of a drive signal VOUT.

FIG. 5 is a diagram illustrating an example of the waveform of the drive signal VOUT. FIG. 5 shows the waveforms of the drive signals VOUT with the dots formed at the medium P having the sizes of the "large dot", the "medium dot", and the "small dot", and "no dots recorded" in comparison.

As shown in FIG. 5, the drive signal VOUT when the "large dot" are formed at the medium P is a waveform in which the trapezoidal waveform Adp1 disposed in the period T1, and the trapezoidal waveform Adp2 disposed in the period T2 are continuous in a cycle Ta. When the drive signal VOUT is supplied to the ejection unit 600, a small amount of ink and a medium amount of ink are ejected from the corresponding nozzle 651 in the cycle Ta. Therefore, the large dot is formed at the medium P by landing and uniting the respective amounts of ink.

The drive signal VOUT when the "medium dot" is formed at the medium P is a waveform in which the trapezoidal waveform Adp1 disposed in the period T1, and the trapezoidal waveform Bdp2 disposed in the period T2 are continuous in the cycle Ta. When the drive signal VOUT is supplied to the ejection unit 600, a small amount of ink is ejected twice from the corresponding nozzle 651 in the cycle Ta. Therefore, the medium dot is formed at the medium P by landing and uniting the respective amounts of ink.

The drive signal VOUT when the "small dot" is formed at the medium P is a waveform in which the trapezoidal waveform Adp1 disposed in the period T1, and a constant waveform, with the voltage Vc, disposed in the period T2 are continuous in the cycle Ta. When the drive signal VOUT is supplied to the ejection unit 600, a small amount of ink is ejected from the corresponding nozzle 651 in the cycle Ta. Accordingly, the ink P lands on the medium P to form the small dot.

The drive signal VOUT corresponding to the "no dots recorded" in which no dots are formed at the medium P in which the trapezoidal waveform Bdp1 disposed in period T1, and a constant waveform, with the voltage Vc, disposed in the period T2 are continuous is a waveform in the cycle Ta. When the drive signal VOUT is supplied to the ejection unit 600, the ink near the opening of the corresponding nozzle 651 only slightly vibrates, and no ink is ejected in the cycle Ta. Therefore, no dots are formed at the medium P without the ink landing.

Here, the waveform that is constant at the voltage Vc is a waveform with a voltage of the immediately preceding voltage Vc which is held in the piezoelectric element 60 which is a capacitive load when none of the trapezoidal waveforms Adp1, Adp2, Bdp1, and Bdp2 is selected as the drive signal VOUT. Therefore, when none of the trapezoidal waveforms Adp1, Adp2, Bdp1, and Bdp2 is selected as the drive signal VOUT, it can be said that the voltage Vc is supplied to the ejection unit 600 as the drive signal VOUT.

The drive signal VOUT as described above is generated when the waveforms of the drive signals COMA and COMB are selected or deselected by the operation of the selection control circuit 210 and the selection circuit 230.

Figure 6:
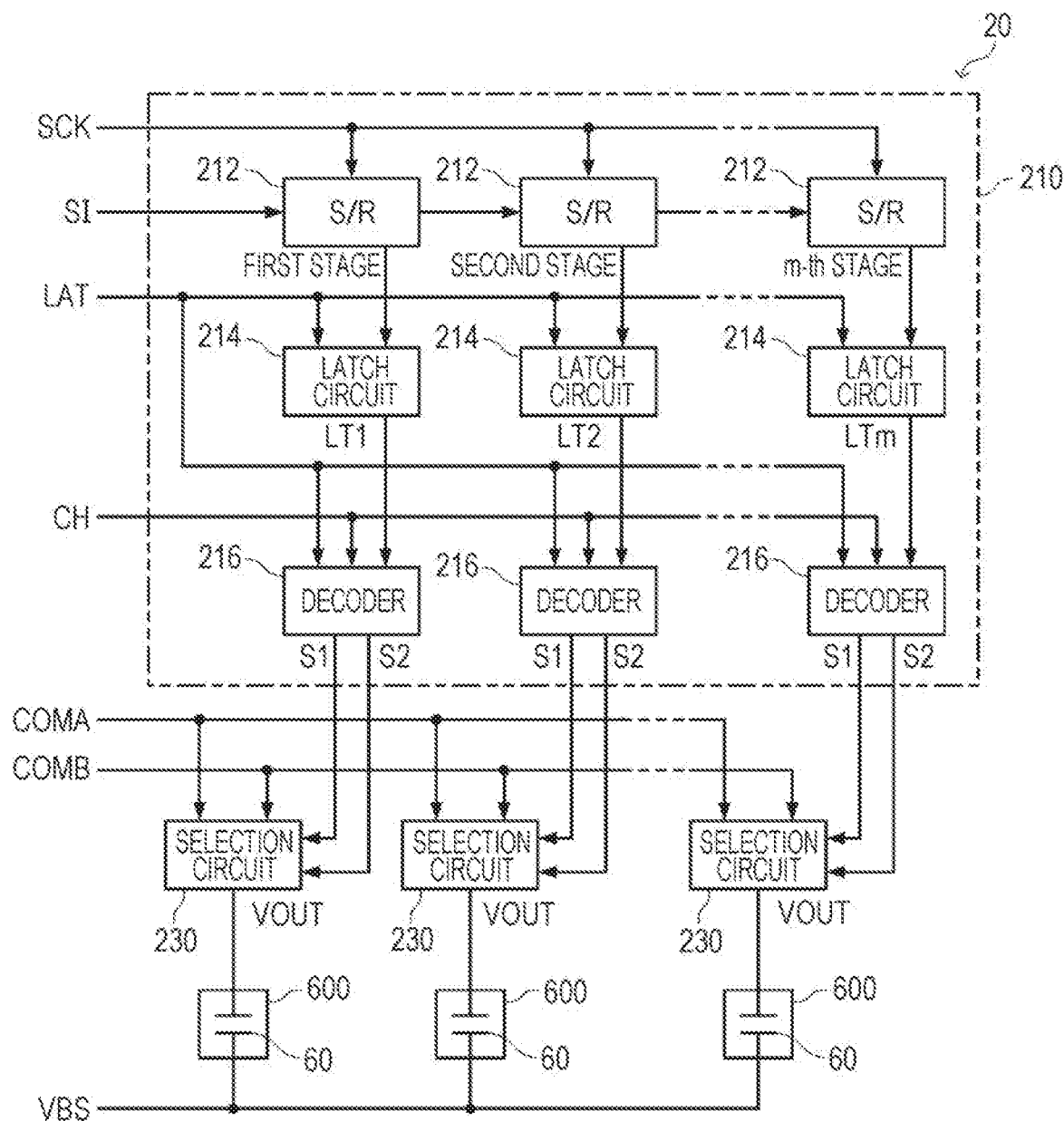
FIG. 6 is a diagram illustrating a configuration of a selection control circuit and a selection circuit.

FIG. 6 is a diagram illustrating a configuration of the selection control circuit 210 and the selection circuit 230. As shown in FIG. 6, the selection control circuit 210 receives the print data signal SI, the latch signal LAT, the change signal CH, and the clock signal SCK. The selection control circuit 210 includes a set of a shift register (S/R) 212, a latch circuit 214, and a decoder 216 corresponding to each of the m ejection units 600. That is, the selection control circuit 210 includes the same number of sets of the shift registers 212, the latch circuits 214, and the decoders 216 as the m ejection units 600.

The print data signal SI, which is synchronized with the clock signal SCK, is a signal of a total of 2 m-bits including 2-bit print data [SIH, SIL] for selecting any one of the "large dot", the "medium dot", the "small dot", and the "no dots recorded" for each of the m ejection units 600. The input print data signal SI is held in the shift register 212 for 2-bit print data [SIH, SIL] included in the print data signal SI corresponding to each of the m ejection units 600. Specifically, the selection control circuit 210 is configured such that m-stage shift registers 212 corresponding to the m ejection units 600 are cascade-coupled to each other, and the print data signal SI input serially is sequentially transferred to the subsequent stage according to the clock signal SCK. In FIG. 6, in order to distinguish the shift registers 212, they are denoted as the first stage, the second stage . . . the m-th stage in order from the upstream where the print data signal SI is input.

The m latch circuits 214 latch the 2-bit print data [SIH, SIL] held by the respective m shift registers 212 at a rise of the latch signal LAT.

Figures 7, 8:
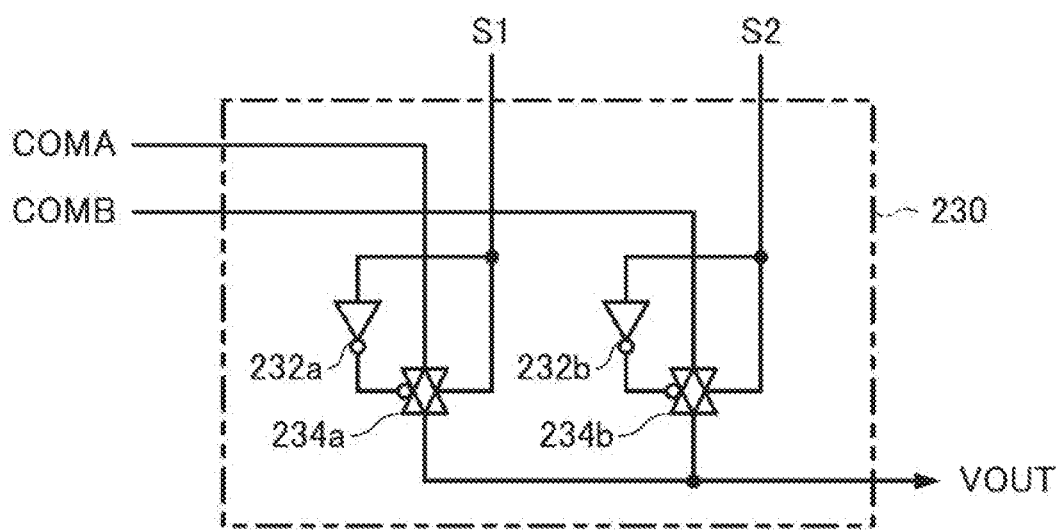
FIG. 7 is a diagram illustrating the decoding contents in a decoder.
FIG. 8 is a diagram illustrating a configuration of a selection circuit corresponding to one ejection unit.

FIG. 7 is a diagram illustrating the decoding contents in the decoder 216. The decoder 216 outputs the selection signals S1 and S2 according to the 2-bit print data [SIH, SIL] latched by the latch circuit 214. For example, when the 2-bit print data [SIH, SIL] is [1, 0], the decoder 216 outputs the logic level of the selection signal S1 as H and L levels in the periods T1 and T2, respectively, and the logic level of the selection signal S2 as L and H levels in the periods T1 and T2, respectively, to the selection circuit 230.

The selection circuits 230 are provided corresponding to the respective ejection units 600. That is, the number of the selection circuits 230 included in the head 20 is m, which is the same as the total number of the ejection units 600. FIG. 8 is a diagram illustrating a configuration of the selection circuit 230 corresponding to one ejection unit 600. As shown in FIG. 8, the selection circuit 230 includes inverters 232a and 232b, which are NOT circuits, and transfer gates 234a and 234b.

The selection signal S1 is input to the non-circled positive control terminal in a transfer gate 234a, while being input to a circled negative control terminal in the transfer gate 234a after logically inverted by an inverter 232a. The drive signal COMA is supplied to an input end of the transfer gate 234a. The selection signal S2 is input to a non-circled positive control terminal in a transfer gate 234b, while being input to a circled negative control terminal in the transfer gate 234b after logically inverted by an inverter 232b. The drive signal COMB is supplied to an input end of the transfer gate 234b. The output ends of the transfer gates 234a and 234b are coupled in common and output as the drive signal VOUT.

Specifically, when the selection signal S1 is at H level, the transfer gate 234a is brought into a conductive state between the input end and the output end, and when the selection signal S1 is at L level, the transfer gate 234a is brought into a non-conductive state between the input end and the output end. When the selection signal S2 is at H level, the transfer gate 234b is brought into a conductive state between the input end and the output end, and when the selection signal S2 is at L level, the transfer gate 234b is brought into a non-conductive state between the input end and the output end. As described above, the selection circuit 230 generates and output the drive signal VOUT by selecting the waveforms of the drive signals COMA and COMB based on the selection signals S1 and S2.

Figure 9:
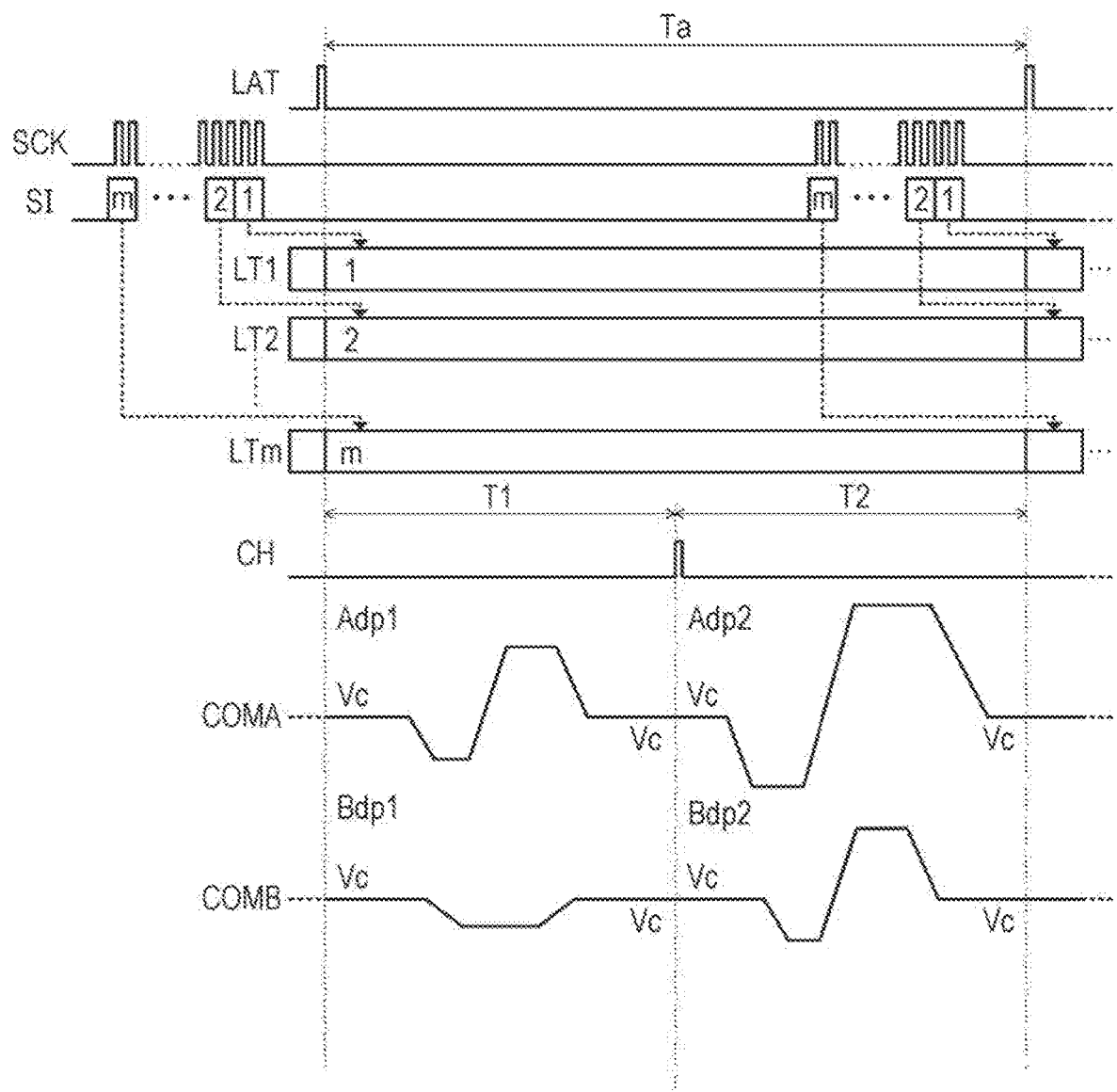
FIG. 9 is a diagram for explaining an operation of the selection control circuit and the selection circuit.

Here, the operation of the selection control circuit 210 and the selection circuit 230 will be described with reference to FIG. 9. FIG. 9 is a diagram for explaining the operation of the selection control circuit 210 and the selection circuit 230. The print data signal SI is serially input in synchronization with the clock signal SCK, and is sequentially transferred in the shift register 212 corresponding to the ejection unit 600. When the input of the clock signal SCK stops, each shift register 212 holds 2-bit print data [SIH, SIL] corresponding to each of the ejection units 600. The print data signal SI is input in the order corresponding to the ejection units 600 for the shift registers 212 of the m-th stage . . . the second stage, the first-stage.

When the latch signal LAT rises, each of the latch circuits 214 simultaneously latches the 2-bit print data [SIH, SIL] held in the respective shift registers 212. In FIG. 9, LT1, LT2 . . . LTm indicate 2-bit print data [SIH, SIL] latched by the latch circuits 214 corresponding to the shift registers 212 of the first stage, the second stage . . . the m-th stage, respectively.

The decoder 216 outputs the logic levels of the selection signals S1 and S2 according to the contents as shown in FIG. 7 in each of the periods T1 and T2 according to a dot size defined by the latched 2-bit print data [SIH, SIL].

Specifically, when the print data [SIH, SIL] is [1, 1], the decoder 216 sets the selection signal S1 to H and H levels in the periods T1 and T2, respectively, and sets the selection signal S2 to L and L levels in the periods T1 and T2, respectively. In this case, the selection circuit 230 selects the trapezoidal waveform Adp1 in the period T1, and selects the trapezoidal waveform Adp2 in the period T2. As a result, the drive signal VOUT corresponding to the "large dot" shown in FIG. 5 is generated.

Also, when the print data [SIH, SIL] is [1, 0], the decoder 216 sets the selection signal S1 to H and L levels in the periods T1 and T2, respectively, and sets the selection signal S2 to L and H levels in the periods T1 and T2, respectively. In this case, the selection circuit 230 selects the trapezoidal waveform Adp1 in the period T1, and selects the trapezoidal waveform Bdp2 in the period T2. As a result, the drive signal VOUT corresponding to the "medium dot" shown in FIG. 5 is generated.

Further, when the print data [SIH, SIL] is [0, 1], the decoder 216 sets the selection signal S1 to H and L levels in the periods T1 and T2, respectively, and sets the selection signal S2 to L and L levels in the periods T1 and T2, respectively. In this case, the selection circuit 230 selects the trapezoidal waveform Adp1 in the period T1, and selects none of the trapezoidal waveforms Adp2 and Bdp2 in the period T2. As a result, the drive signal VOUT corresponding to the "small dot" shown in FIG. 5 is generated.

Further, when the print data [SIH, SIL] is [0, 0], the decoder 216 sets the selection signal S1 to L and L levels in the periods T1 and T2, respectively, and sets the selection signal S2 to the H and L levels in the periods T1 and T2, respectively. In this case, the selection circuit 230 selects the trapezoidal waveform Bdp1 in the period T1, and selects none of the trapezoidal waveforms Adp2 and Bdp2 in the period T2. As a result, the drive signal VOUT corresponding to "no dots recorded" shown in FIG. 5 is generated.

As mentioned above, the selection control circuit 210 and the selection circuit 230 select the waveforms of the drive signals COMA and COMB based on the print data signal SI, the latch signal LAT, the change signal CH, and the clock signal SCK to output the selected waveforms as a drive signal VOUT to the ejection unit 600.

1.5 Drive Circuit Configuration

Next, the configuration and the operation of the drive circuits 50-a and 50-b that output the drive signals COMA and COMB will be described. Here, the drive circuit 50-a and the drive circuit 50-b have the same configuration except that the input signal and the output signal are different. Therefore, in the following description, only the configuration and the operation of the drive circuit 50-a will be described, and the description of the configuration and the operation of the drive circuit 50-b will be omitted.

The drive circuit 50-a first converts the original drive signal dA into an analog signal, and second, feeds back the output drive signal COMA, and corrects the deviation between the attenuation signal based on the drive signal COMA and the target signal by a high-frequency component of the drive signal COMA to generates a modulation signal according to the corrected signal. Third, the drive circuit 50-a generates an amplified modulation signal by switching transistors M1 and M2 according to the modulation signal, and fourth, demodulates the amplified modulation signal by smoothing the amplified modulation signal with a low-pass filter to output the demodulated signal as the drive signal COMA.

Figure 10:
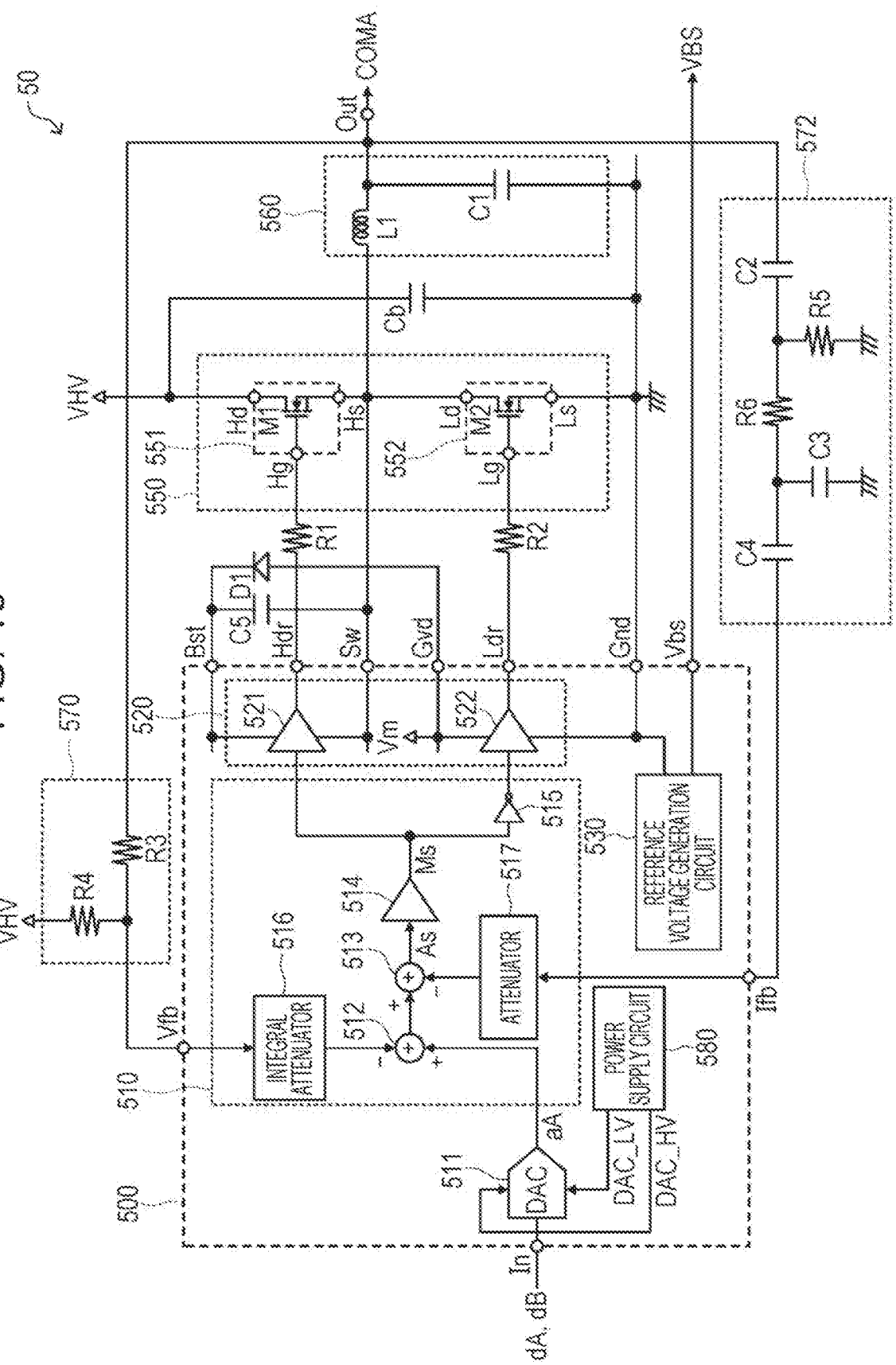
FIG. 10 is a diagram illustrating a circuit configuration of a drive circuit.

FIG. 10 is a diagram illustrating a circuit configuration of the drive circuit 50-a. As shown in FIG. 10, the drive circuit 50-a includes a modulation circuit 510 that modulates the original drive signal dA input from the control circuit 100 to output a modulation signal Ms, an amplifier circuit 550 that amplifies the modulation signal Ms to output an amplified modulation signal, and a smoothing circuit 560 that demodulates the amplified modulation signal to output the drive signal COMA for driving the piezoelectric element 60. Here, the smoothing circuit 560 is an example of a demodulation circuit.

Specifically, the drive circuit 50-a includes an integrated circuit 500 including the modulation circuit 510, the amplifier circuit 550, the smoothing circuit 560, a first feedback circuit 570, and a second feedback circuit 572, and other multiple circuit elements.

The integrated circuit 500 is electrically coupled to the outside of the integrated circuit 500 through a plurality of terminals including a terminal In, a terminal Bst, a terminal Hdr, a terminal Sw, a terminal Gvd, a terminal Ldr, a terminal Gnd, and a terminal Vbs. The integrated circuit 500 modulates the original drive signal dA input from the terminal In to output an amplification control signal for driving each of the transistors M1 and M2 included in the amplifier circuit 550.

As shown in FIG. 10, the integrated circuit 500 includes a digital-to-analog converter (DAC) 511, the modulation circuit 510, a gate drive circuit 520, a reference voltage generation circuit 530, and a power supply circuit 580.

The power supply circuit 580 generates a first voltage signal DAC_HV and a second voltage signal DAC_LV to supply them to the DAC 511.

The DAC 511 converts the digital original drive signal dA that defines the waveform of the drive signal COMA into an original drive signal aA that is an analog signal having a voltage value between the first voltage signal DAC_HV and the second voltage signal DAC_LV to output the converted original drive signal aA to the modulation circuit 510. Note that the maximum value of the voltage amplitude of the original drive signal aA is defined by the first voltage signal DAC_HV, and the minimum value is defined by the second voltage signal DAC_LV. That is, the first voltage signal DAC_HV is a reference voltage on the high voltage side in the DAC 511, and the second voltage signal DAC_LV is a reference voltage on the low voltage side in the DAC 511. A signal obtained by amplifying the analog original drive signal aA is the drive signal COMA. That is, the original drive signal aA corresponds to a target signal before the amplification of the drive signal COMA. The voltage amplitude of the original drive signal aA in the present embodiment is, for example, 1 V to 2 V.

The modulation circuit 510 generates the modulation signal Ms obtained by modulating the original drive signal aA to outputs the generated modulation signal Ms to the amplifier circuit 550 via the gate drive circuit 520. Modulation circuit 510 includes adders 512 and 513, a comparator 514, an inverter 515, an integral attenuator 516, and an attenuator 517.

The integral attenuator 516 attenuates and integrates the voltage of a terminal Out input via a terminal Vfb, that is, the drive signal COMA, and supplies the attenuated and integrated signal to a negatives input end of the adder 512. The original drive signal aA is input to a positive input end of the adder 512. The adder 512 supplies a voltage obtained by subtracting and integrating the voltage input to the negative input end from the voltage input to the positive input end to the positive input end of the adder 513.

Here, the maximum value of the voltage amplitude of the original drive signal aA is about 2 V as described above, whereas the maximum value of the voltage of the drive signal COMA may exceed 40 V in some cases. For this reason, the integral attenuator 516 attenuates the voltage of the drive signal COMA input via the terminal Vfb in order to match the amplitude ranges of both voltages when obtaining the deviation.

The attenuator 517 supplies a voltage obtained by attenuating the high-frequency component of the drive signal COMA input via a terminal Ifb to the negative input end of the adder 513. The voltage output from the adder 512 is input to the positive input end of the adder 513. The adder 513 outputs, to the comparator 514, a voltage signal As obtained by subtracting the voltage input to the negative input end from the voltage input to the positive input end.

The voltage signal As is a voltage obtained by subtracting the voltage of the signal supplied to the terminal Vfb and further subtracting the voltage of the signal supplied to the terminal Ifb from the adder 513 is from the voltage of the original drive signal aA. For this reason, the voltage of the voltage signal As output from the adder 513 is a signal obtained by correcting the deviation obtained by subtracting the attenuation voltage of the drive signal COMA from the target voltage of the original drive signal aA by the high-frequency component of the drive signal COMA.

The comparator 514 outputs the pulse-modulated modulation signal Ms based on the voltage signal As output from the adder 513. Specifically, the comparator 514 outputs the modulation signal Ms which is at H level when the voltage signal As output from the adder 513 is equal to or higher than a threshold Vth1 described later in a case where the voltage is rising, and is at L level when the voltage signal As falls below a threshold Vth2 described later in a case where the voltage is dropping. Here, the thresholds Vth1 and Vth2 are set in a relationship in which the threshold Vth1 is greater than the threshold Vth2. The frequency and the duty ratio of the modulation signal Ms change in accordance with the original drive signals dA and aA. Therefore, the attenuator 517 adjusts the modulation gain corresponding to the sensitivity, so that the amount of change in the frequency and the duty ratio of the modulation signal Ms can be adjusted.

The modulation signal Ms output from the comparator 514 is supplied to a gate driver 521 included in the gate drive circuit 520. The modulation signal Ms is also supplied to a gate driver 522 included in the gate drive circuit 520 after the logic level is inverted by the inverter 515. That is, the logic levels of the signals supplied to the gate driver 521 and the gate driver 522 are mutually exclusive.

Here, the timing may be controlled so that the logic levels of the signals supplied to the gate driver 521 and the gate driver 522 are not H level at the same time. In other words, strictly speaking, "exclusive" here means that the logic levels of the signals supplied to the gate driver 521 and the gate driver 522 are not H level at the same time. For details, this means that the transistors M1 and M2 included in the amplifier circuit 550 are not turned on at the same time.

The modulation signal is, in a narrow sense, the modulation signal Ms, but assuming that the signal is pulse-modulated according to the analog original drive signal aA based on the digital original drive signal dA, a signal in which the logical level of the modulation signal Ms is inverted is also included in the modulation signal. That is, the modulation signal output from the modulation circuit 510 includes not only the modulation signal Ms input to the gate driver 521, but also a signal in which the logic level of the modulation signal Ms input to the gate driver 522 is inverted, and a signal whose timing is controlled with respect to the modulation signal Ms.

The gate drive circuit 520 includes the gate driver 521 and the gate driver 522.

The gate driver 521 shifts the level of the modulation signal Ms output from the comparator 514 to output the level-shifted modulation signal Ms as a first amplification control signal from the terminal Hdr. The higher side of the power supply voltage of the gate driver 521 is a voltage applied via the terminal Bst, and the lower side is a voltage applied via the terminal Sw. The terminal Bst is coupled to one end of a capacitor C5 and the cathode of a diode D1 for backflow prevention. The terminal Sw is coupled to the other end of the capacitor C5. The anode of the diode D1 is coupled to the terminal Gvd. As a result, a voltage Vm which is a DC voltage of, for example, 7.5 V supplied from a power supply circuit (not shown) is supplied to the anode of the diode D1. Therefore, the potential difference between the terminal Bst and the terminal Sw is approximately equal to the potential difference between both ends of the capacitor C5, that is, the voltage Vm. The gate driver 521 outputs, from the terminal Hdr, the first amplification control signal having a voltage higher than, by the voltage Vm, that of the terminal Sw according to the input modulation signal Ms.

The gate driver 522 operates at a lower potential than the gate driver 521. The gate driver 522 shifts the level of the signal obtained by inverting, by the inverter 515, the logical level of the modulation signal Ms output from the comparator 514 to output the level-shifted signal from the terminal Ldr as a second amplification control signal. The voltage Vm is applied to the higher side of the power supply voltage of the gate driver 522, and the ground potential of, for example, 0 V is supplied to the lower side via the terminal Gnd. The second amplification control signal having a voltage higher than, by the voltage Vm, that of the terminal Gnd according to the signal input to the gate driver 522 is output from the terminal Ldr.

The reference voltage generation circuit 530 outputs the reference voltage signal VBS of, for example, a DC voltage of 6 V supplied to a terminal different from the terminal to which the drive signal VOUT of the piezoelectric element 60 is supplied. The reference voltage generation circuit 530 is configured by a constant voltage circuit including a band gap reference circuit, for example. The reference voltage signal VBS is a signal of a potential serving as a reference for driving the piezoelectric element 60, and may be, for example, a signal of a ground potential.

The amplifier circuit 550 includes the transistor M1 housed in a housing 551 and the transistor M2 housed in a housing 552.

The drain of the transistor M1 is electrically coupled to the terminal Hd of the housing 551. A voltage VHV, which is a DC voltage of 42 V, for example, is supplied to the drain of the transistor M1 via the terminal Hd. The gate of the transistor M1 is electrically coupled to a terminal Hg of the housing 551. Further, the terminal Hg of the housing 551 is electrically coupled to one end of a resistor R1, and the other end of the resistor R1 is electrically coupled to the terminal Hdr of the integrated circuit 500. That is, the first amplification control signal output from the terminal Hdr of the integrated circuit 500 is supplied to the gate of the transistor M1. The source of the transistor M1 is electrically coupled to a terminal Hs of the housing 551. The terminal Hs of the housing 551 is electrically coupled to the terminal Sw of the integrated circuit 500.

The drain of the transistor M2 is electrically coupled to the terminal Ld of the housing 552. Further, the terminal Ld of the housing 552 is electrically coupled to the terminal Sw of the integrated circuit 500. That is, the drain of the transistor M2 and the source of the transistor M1 are electrically coupled to each other. The gate of the transistor M2 is electrically coupled to a terminal Lg of the housing 552. The terminal Lg of the housing 552 is electrically coupled to one end of a resistor R2, and the other end of the resistor R2 is electrically coupled to the terminal Ldr of the integrated circuit 500. That is, the second amplification control signal output from the terminal Ldr of the integrated circuit 500 is supplied to the gate of the transistor M2. The source of the transistor M2 is electrically coupled to a terminal Ls of the housing 552. The ground potential is supplied to the source of the transistor M2 via the terminal Ls of the housing 552.

In the amplifier circuit 550 configured as described above, when the transistor M1 is turned off and the transistor M2 is turned on, the voltage of the node to which the terminal Sw is coupled is the ground potential. Therefore, the voltage Vm is supplied to the terminal Bst. On the other hand, when the transistor M1 is turned on and the transistor M2 is turned off, the voltage of the node to which the terminal Sw is coupled is the voltage VHV. Therefore, a voltage signal of the potential of the voltage VHV+Vm is supplied to the terminal Bst.

That is, the gate driver 521 that drives the transistor M1 uses the capacitor C5 as a floating power supply, and when the potential of the terminal Sw changes to 0 V or the voltage VHV according to the operation of the transistor M1 and the transistor M2, the gate driver 521 supplies, to the gate of the transistor M1, the first amplification control signal whose L level is the potential of the voltage VHV and whose H level is the potential of the voltage VHV+the voltage Vm.

On the other hand, the gate driver 522 that drives the transistor M2 supplies, to the gate of the transistor M2, the second amplification control signal whose L level is the ground potential and whose H level is the potential of the voltage Vm irrespective of the operation of the transistor M1 and the transistor M2.

As mentioned above, the amplifier circuit 550 includes the transistor M1 electrically coupled to the terminal Hd to which the voltage VHV is input as a power supply voltage, and the transistor M2 electrically coupled to the terminal Ls to which the ground potential is input as a reference voltage. The transistor M1 and the transistor M2 amplifies the modulation signal Ms obtained by modulating the original drive signals dA and aA, so that an amplified modulation signal is generated at a coupling point at which the source of the transistor M1 and the drain of the transistor M2 are commonly coupled. The generated amplified modulation signal is input to the smoothing circuit 560. Here, the terminal Hd is an example of a first input terminal of the amplifier circuit 550, and the terminal Ls is an example of a second input terminal of the amplifier circuit 550. Further, the transistor M1 is an example of the first transistor, and the transistor M2 is an example of the second transistor. The housing 551 that houses the transistor M1 is an example of the first housing, and the housing 552 that houses the transistor M2 is an example of the second housing.

A capacitor Cb functioning as a bypass capacitor is electrically coupled to both ends of the amplifier circuit 550. Specifically, one end of the capacitor Cb is electrically coupled to the terminal Hd, of the housing 551, which is electrically coupled to the drain of the transistor M1, and the other end of the capacitor Cb is electrically coupled to the terminal Ls, of the housing 552, which is electrically coupled to the source of the transistor M2. Thus, the fluctuation of the potential of the voltage VHV caused by the operation of the amplifier circuit 550 is reduced, and as a result, the fluctuation of the maximum voltage value of the amplified modulation signal output from the amplifier circuit 550 is reduced. This capacitor Cb is an example of a capacitive element.

The smoothing circuit 560 generates the drive signal COMA by smoothing the amplified modulation signal output from the amplifier circuit 550 to output the drive signal COMA from the drive circuit 50-a. Smoothing circuit 560 includes a coil L1 and a capacitor C1.

The amplified modulation signal output from the amplifier circuit 550 is input to one end of the coil L1. The other end of the coil L1 is coupled to a terminal Out serving as an output of the drive circuit 50-a. That is, the drive circuit 50-a is coupled to each of the selection circuits 230 via the terminal Out. As a result, the drive signal COMA output from the drive circuit 50-a is supplied to the selection circuit 230. The other end of the coil L1 is also coupled to one end of the capacitor C1. The other end of the capacitor C1 is coupled to the ground potential. That is, the coil L1 and the capacitor C1 smooths the amplified modulation signal output from the amplifier circuit 550 to demodulate the signal, and output the demodulated signal as the drive signal COMA.

The first feedback circuit 570 includes a resistor R3 and a resistor R4. One end of the resistor R3 is coupled to the terminal Out from which the drive signal COMA is output, and the other end is coupled to the terminal Vfb and one end of the resistor R4. The voltage VHV is supplied to the other end of the resistor R4. As a result, the drive signal COMA that has passed through the first feedback circuit 570 from the terminal Out is fed back to the terminal Vfb in a pulled-up state.

The second feedback circuit 572 includes capacitors C2, C3, and C4 and resistors R5 and R6.

One end of the capacitor C2 is coupled to the terminal Out from which the drive signal COMA is output, and the other end is coupled to one end of the resistor R5 and one end of the resistor R6. The ground potential is supplied to the other end of the resistor R5. Thus, the capacitor C2 and the resistor R5 function as a high pass filter. The cut-off frequency of the high-pass filter is set to, for example, about 9 MHz. The other end of the resistor R6 is coupled to one end of the capacitor C4 and one end of the capacitor C3. The ground potential is supplied to the other end of the capacitor C3. Thus, the resistor R6 and the capacitor C3 function as a low pass filter (LPF). The cutoff frequency of the LPF is set to, for example, about 160 MHz. In this way, since the second feedback circuit 572 includes the high-pass filter and the low-pass filter, so that the second feedback circuit 572 functions as a band pass filter that passes a predetermined frequency range of the drive signal COMA.

The other end of the capacitor C4 is coupled to the terminal Ifb of the integrated circuit 500. As a result, a signal from which the DC component has been cut out of the high frequency components of the drive signal COMA that has passed through the second feedback circuit 572 that functions as the band pass filter is fed back to the terminal Ifb.

The drive signal COMA output from the terminal Out is a signal obtained by smoothing the amplified modulation signal by the smoothing circuit 560. The drive signal COMA is integrated/subtracted via the terminal Vfb, and then fed back to the adder 512. Therefore, the drive circuit 50-a self-oscillates at a frequency determined by the feedback delay and the feedback transfer function.

However, since the feedback path via the terminal Vfb has a large delay amount, so that there is a case where the frequency of the self-oscillation cannot be made high enough to ensure the accuracy of the drive signal COMA simply by the feedback via the terminal Vfb. Therefore, the delay in the entire circuit is reduced by providing a path for feeding back the high-frequency component of the drive signal COMA via the terminal Ifb separately from the path via the terminal Vfb. As a result, the frequency of the voltage signal As can be made high enough to ensure the accuracy of the drive signal COMA as compared with the case where there is no path via the terminal Ifb.

Figure 11:
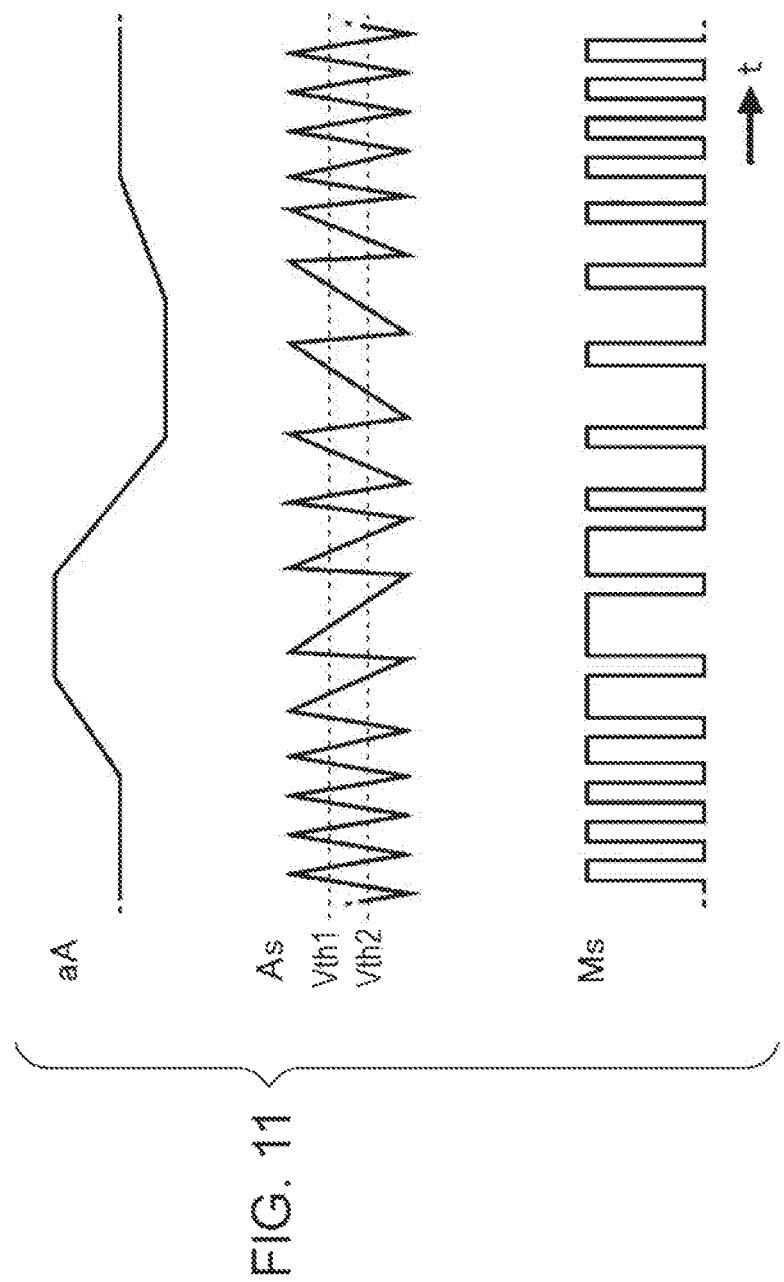
FIG. 11 is a diagram illustrating waveforms of a voltage signal As and a modulation signal Ms in association with a waveform of an analog original drive signal aA.

FIG. 11 is a diagram illustrating the waveforms of the voltage signal As and the modulation signal Ms in association with the waveform of the analog original drive signal aA.

As shown in FIG. 11, the voltage signal As is a triangular wave, and its oscillation frequency varies according to the voltage of the original drive signal aA. Specifically, the frequency is highest when the voltage is an intermediate value, and is lower as the voltage is higher or lower than the intermediate value.

Further, the slope of the triangular wave of the voltage signal As at the rise of the voltage is almost equal to that at the fall of the voltage when the voltage is near the intermediate value. Therefore, the duty ratio of the modulation signal Ms obtained by comparing the voltage signal As with the thresholds Vth1 and Vth2 of the comparator 514 is approximately 50%. When the voltage of the voltage signal As increases from the intermediate value, the downward slope of the voltage signal As is gentle. Therefore, the period during which the modulation signal Ms is at H level is relatively long, and the duty ratio of the modulation signal Ms increases. On the other hand, when the voltage of the voltage signal As decreases from the intermediate value, the upward slope of the voltage signal As decreases. Therefore, the period during which the modulation signal Ms is at H level is relatively short, and the duty ratio of the modulation signal Ms decreases.

The gate driver 521 turns on or off the transistor M1 based on the modulation signal Ms. That is, the gate driver 521 turns on the transistor M1 when the modulation signal Ms is at H level, and turns off the transistor M1 when the modulation signal Ms is at L level. The gate driver 522 turns on or off the transistor M2 based on the logically inverted signal of the modulation signal Ms. That is, the gate driver 522 turns off the transistor M2 when the modulation signal Ms is at H level and turns on the transistor M2 when the modulation signal Ms is at L level.

Therefore, the voltage value of the drive signal COMA obtained by smoothing the amplified modulation signal output from the amplifier circuit 550 by the smoothing circuit 560 increases as the duty ratio of the modulation signal Ms increases, and decreases as the duty ratio decreases. That is, control is performed so that the waveform of the drive signal COMA matches the waveform obtained by enlarging the voltage of the original drive signal aA obtained by analog converting the digital original drive signal dA.

In addition, since the drive circuit 50-*a* advantageously uses a pulse density modulation, which has a larger change width of the duty ratio than a pulse width modulation in which the modulation frequency is fixed. The minimum positive pulse width and minimum negative pulse width that can be used in the drive circuit 50-*a* are limited by circuit characteristics. Therefore, in the pulse width modulation in which the frequency is fixed, the change width of the duty ratio is limited within a predetermined range. In contrast, with the pulse density modulation, as the voltage of the voltage signal As is away from the intermediate value, the oscillation frequency decreases, and as a result, it is possible to further increase the duty ratio in a region where the voltage is high. Further, in a region where the voltage is low, the duty ratio can be further reduced. Therefore, it is possible to secure a wider range of the change width of the duty ratio by employing self-oscillation type pulse density modulation.

1.6 Mounting Layout of Drive Circuit on Substrate

Figure 12:
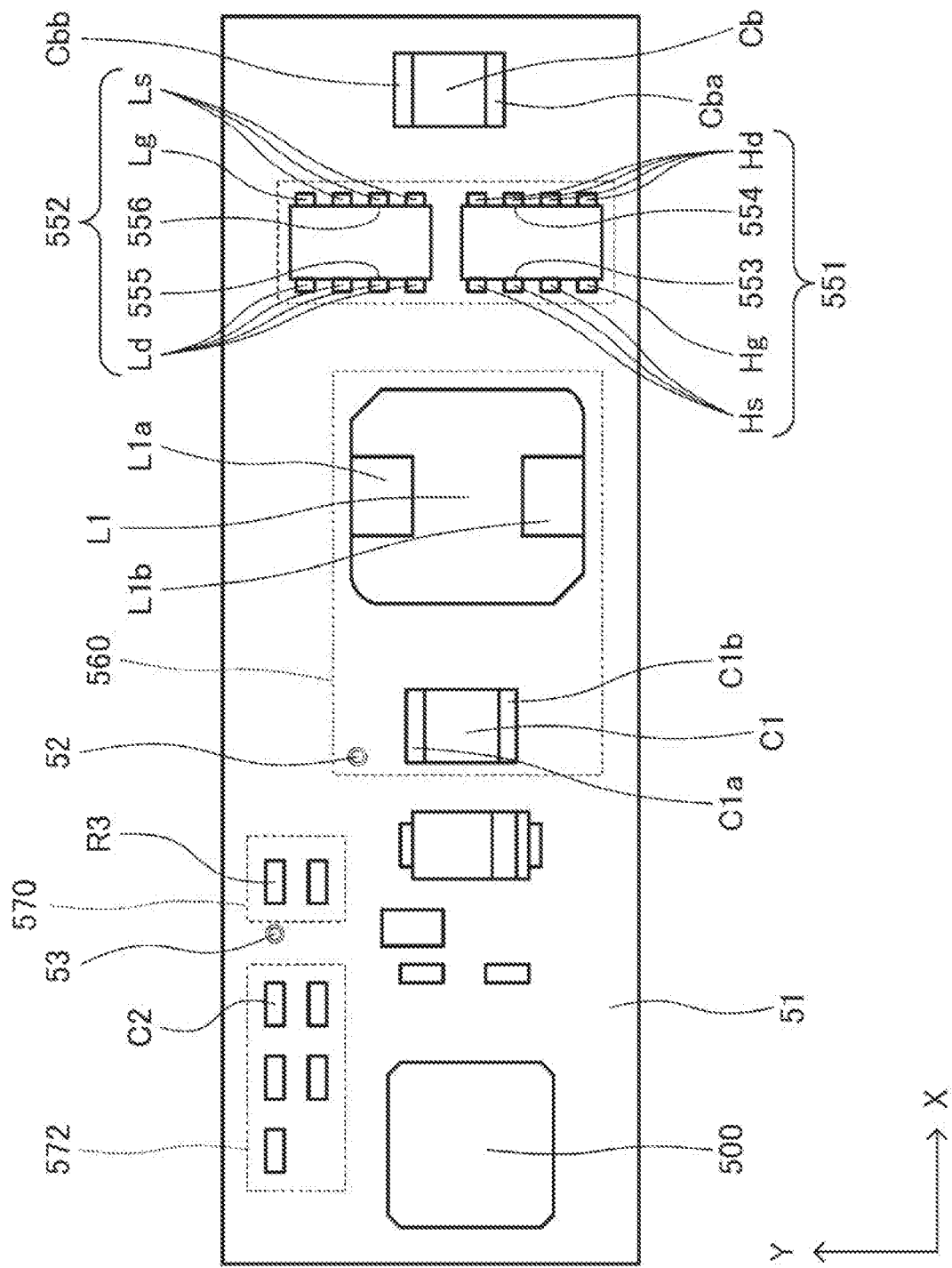
FIG. 12 is a diagram illustrating an arrangement of respective circuits included in the drive circuit on a substrate.
Figure 13:
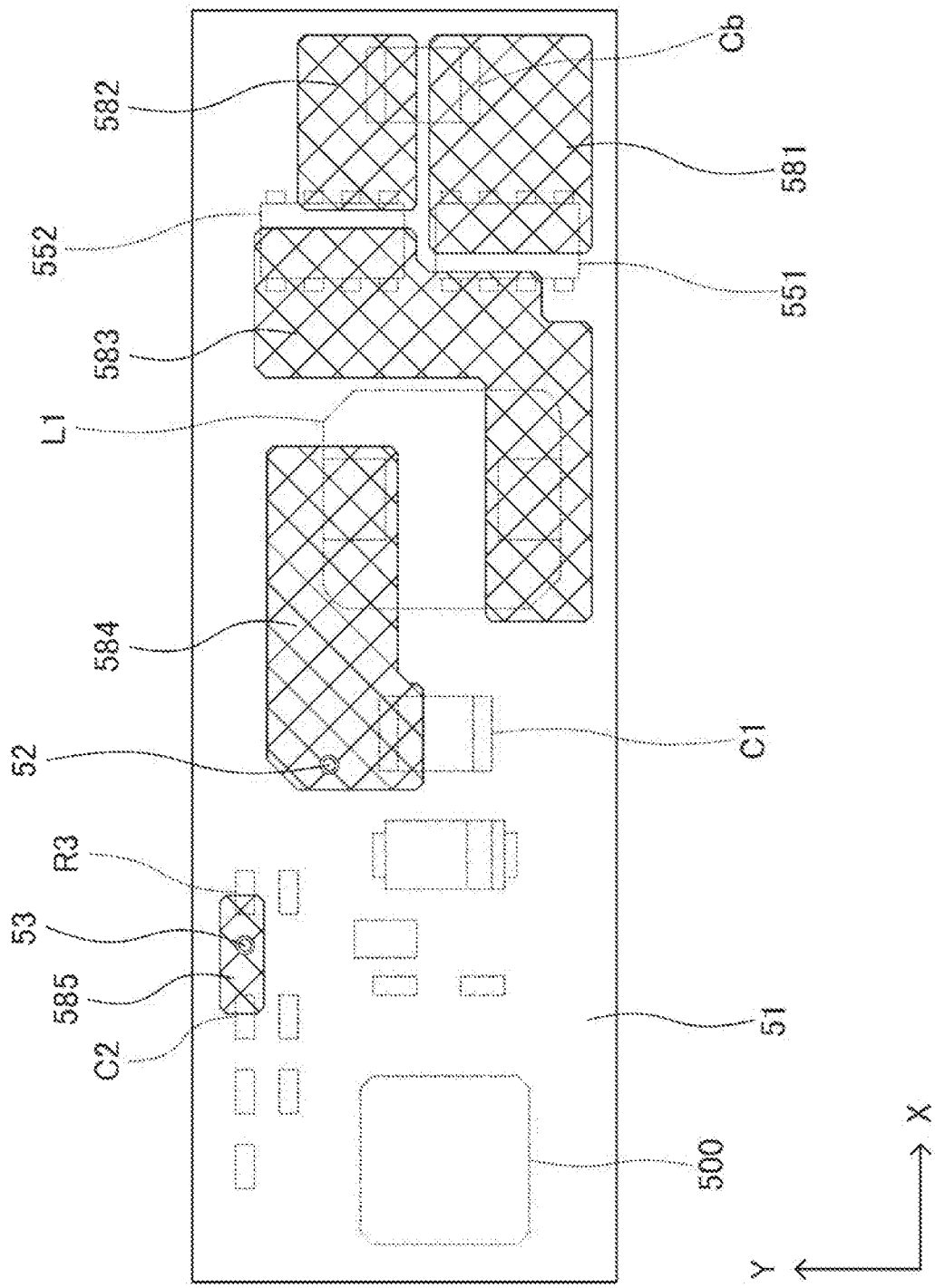
FIG. 13 is a diagram illustrating an example of wiring that electrically couples respective circuits included in the drive circuit.
Figure 14:
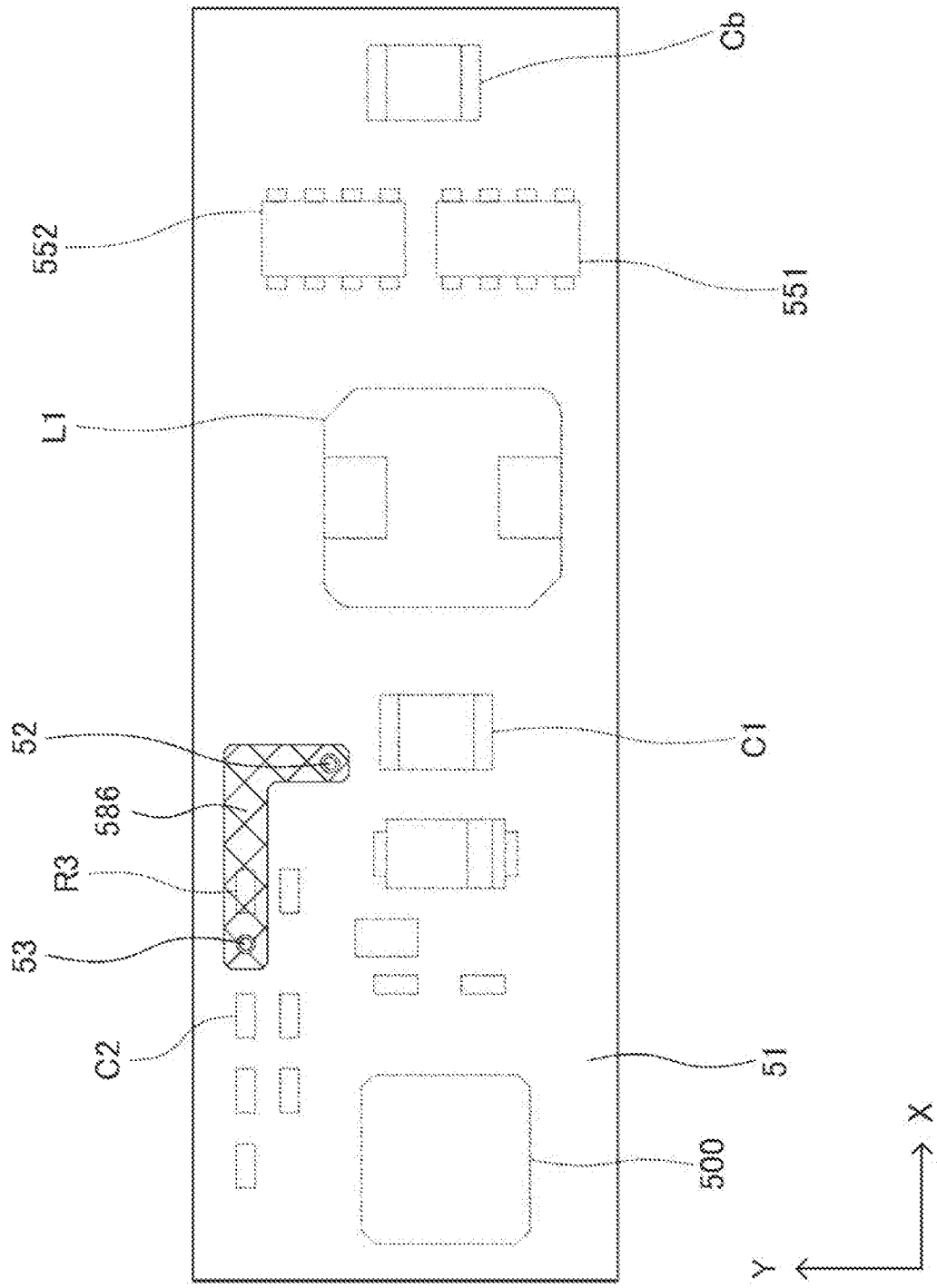
FIG. 14 is a diagram illustrating an example of wiring that electrically couples respective circuits included in a drive circuit provided in a wiring layer different from that in FIG. 13.

Next, the arrangement of respective circuits included in the drive circuit 50-*a* mounted on a substrate 51 will be described with reference to FIGS. 12 to 14. FIG. 12 is a diagram illustrating an arrangement of respective circuits included in the drive circuit 50-*a* on the substrate 51. FIG. 13 is a diagram illustrating an example of wiring that electrically couples the respective circuits included in the drive circuit 50-*a*. FIG. 14 is a diagram illustrating an example of wiring that electrically couples the respective circuits included in the drive circuit 50-*a* provided in a wiring layer different from that in FIG. 13. In the following description, as shown in FIGS. 12 to 14, the description will be made using the X direction and the Y direction that are orthogonal to each other.

The substrate 51 according to the present embodiment has a substantially rectangular shape including a pair of short sides that faces each other in the X direction and a pair of long sides that faces each other in the Y direction, and the description will be made on the assumption that the substrate 51 is a multilayer substrate having a plurality of the wiring layers. FIGS. 12 to 14 shows only the drive circuit 50-*a* is mounted on the substrate 51, but a plurality of circuits including the drive circuit 50-*b* may be mounted on the substrate 51.

As shown in FIG. 12, for the substrate 51, the integrated circuit 500 including the modulation circuit 510, the amplifier circuit 550, the smoothing circuit 560, and the capacitor Cb are provided on the same surface of the substrate 51 in order of the integrated circuit 500, the smoothing circuit 560, the amplifier circuit 550, and the capacitor Cb along the X direction. In other words, the amplifier circuit 550 including the housing 551 including the terminal Hd and the housing 552 including the terminal Ls, and the capacitor Cb are provided on the same surface of the substrate 51. On the substrate 51, the smoothing circuit 560 is located between the integrated circuit 500 including the modulation circuit 510 and the amplifier circuit 550, and the amplifier circuit 550 is located between the smoothing circuit 560 and the capacitor Cb.

As mentioned above, the possibility that the switching noise generated in the amplifier circuit 550 is superimposed on the modulation circuit 510 is reduced by providing the amplifier circuit 550 that performs the switching operation at a position away from the integrated circuit 500 including the modulation circuit 510 in the drive circuit 50-*a*. As described above, the modulation circuit 510 generates the modulation signal Ms that is the basis of the drive signal COMA. Therefore, the possibility that the switching noise is superimposed on the integrated circuit 500 including the modulation circuit 510 is reduced, so that the accuracy of the modulation signal Ms output from the integrated circuit 500 is improved. Therefore, the accuracy of the drive signal COMA generated based on the modulation signal Ms is improved.

The housing 551 that houses the transistor M1 included in the amplifier circuit 550 and the housing 552 that houses the transistor M2 are provided side by side in the Y direction. Specifically, the housing 551 that houses the transistor M1 includes a side 554 on which the terminal Hd is provided, and a side 553 that faces the side 554 in the X direction. The housing 551 is mounted on the substrate 51 such that the distance between the side 554 and the capacitor Cb is shorter than the distance between the side 553 and the capacitor Cb. In other words, the terminal Hd that is electrically coupled to the drain of the transistor M1 is located on a side, of the housing 551, toward the capacitor Cb that functions as a bypass capacitor. Here, the side 554 of the housing 551 is an example of a first side, and the side 553 is an example of a second side.

In addition, the housing 552 that houses the transistor M2 includes a side 556 on which the terminal Ls is provided, and a side 555 that faces the side 556 in the X direction. The housing 552 is mounted on the substrate 51 such that the distance between the side 556 and the capacitor Cb is shorter than the distance between the side 555 and the capacitor Cb. In other words, the terminal Ls that is electrically coupled to the source of the transistor M2 is located on a side, of the housing 552, toward the capacitor Cb that functions as a bypass capacitor. Here, the side 556 of the housing 552 is an example of a third side, and the side 555 is an example of a fourth side.

As shown in FIG. 13, the terminal Hd of the housing 551 and a terminal Cba of the capacitor Cb are, in the substrate 51, electrically coupled by wiring 581 to the amplifier circuit 550 including the housing 551 including the terminal Hd and the housing 552 including the terminal Ls on the surface of the substrate 51 provided with the capacitor Cb, and the terminal Ls of the housing 552 and a terminal Cbb of the capacitor Cb are, in the substrate 51, are electrically coupled by wiring 582 to the amplifier circuit 550 including the housing 551 including the terminal Hd and the housing 552 including the terminal Ls on the surface of the substrate 51 provided with the capacitor Cb. Here, the wiring 581 is an example of first wiring, and the wiring 582 is an example of second wiring.

A current accompanying the switching operation of the amplifier circuit 550 flows through the capacitor Cb functioning as a bypass capacitor. That is, the current accompanying the switching operation of the transistors M1 and M2 of the amplifier circuit 550 also flows through the capacitor Cb. Therefore, a high-frequency current accompanying the switching operation of the amplifier circuit 550 also flows through the wiring path that electrically couples the amplifier circuit 550 and the capacitor Cb. Since the terminal Hd electrically coupled to the drain of the transistor M1 is located on the side toward the capacitor Cb, and the terminal Ls electrically coupled to the source of the transistor M2 is located on the side toward the capacitor Cb, the amplifier circuit 550 is electrically coupled to the capacitor Cb, so that it is possible to shorten the wiring length through which the current accompanying the switching operation travels. Therefore, the radiation noise generated by the switching operation of the amplifier circuit 550 including the transistors M1 and M2 is reduced, and as a result, the possibility that the switching noise generated in the amplifier circuit 550 is superimposed on the modulation circuit 510 is further reduced.

The amplified modulation signal amplified by the amplifier circuit 550 is output to the smoothing circuit 560 via wiring 583 through which the terminal Hs, of the housing 551, to which the source of the transistor M1 is electrically coupled, and the terminal Ld, of the housing 552, to which the drain of the transistor M2 is electrically coupled are electrically coupled to each other.

For the smoothing circuit 560 the capacitor C1 is located toward the integrated circuit 500 and the coil L1 is located toward the amplifier circuit 550 between the integrated circuit 500 including the modulation circuit 510 and the amplifier circuit 550. In other words, the capacitor C1 is located between the modulation circuit 510 and the coil L1 on the substrate 51, and the coil L1 is located between the amplifier circuit 550 and the capacitor C1 on the substrate 51.

The amplified modulation signal input to the smoothing circuit 560 is input to the coil L1 included in the smoothing circuit 560 via an electrode Lia, and is output from the coil L1 to wiring 584 via an electrode Lib. An electrode Cia, which is one end of the capacitor C1 included in the smoothing circuit 560, is coupled to the wiring 584. As described above, an electrode C1b, which is the other end of the capacitor C1, is coupled to the ground potential. That is, the capacitor C1 includes the electrode C1a electrically coupled to the coil L1 and the electrode C1b different from the electrode C1a.

As a result, the drive signal COMA smoothed and demodulated by the coil L1 and the capacitor C1 travels through the wiring 584. The drive signal COMA is output from a terminal Out (not shown) after traveling through the wiring 584.

Also, as shown in FIG. 12, the second feedback circuit 572 and the integrated circuit 500 are located side by side in a direction along the Y direction, and the first feedback circuit 570 and the second feedback circuit 572 are located side by side in a direction along the X direction. As shown in FIG. 13 and FIG. 14, the drive signal COMA traveling through the wiring 584 is fed back as a feedback signal to the first feedback circuit 570 and the second feedback circuit 572 via a via 52 included in the wiring 584, wiring 586 electrically coupled to the via 52, a via 53 electrically coupled to the wiring 586, and wiring 585 electrically coupled to the via 53. The wiring 585 is electrically coupled to the resistor R3 included in the first feedback circuit 570 and the capacitor C2 included in the second feedback circuit 572. As a result, the drive signal COMA is input to the first feedback circuit 570 and the second feedback circuit 572 as a feedback signal.

The drive signal COMA input to the first feedback circuit 570 is input to the terminal Vfb of the integrated circuit 500 via wiring (not shown) and the resistor R3 included in the first feedback circuit 570. The drive signal COMA input to the second feedback circuit 572 is input to the terminal Ifb of the integrated circuit 500 via wiring (not shown), the capacitors C2, C3, and C4, and the resistors R5 and R6 that constitute the second feedback circuit 572.

In this case, the capacitor C1 of the smoothing circuit 560 is provided such that the distance between the electrode C1a and circuit elements constituting the first feedback circuit 570 and the second feedback circuit 572 is shorter than the distance between the electrode C1b and circuit elements constituting the first feedback circuit 570 and the second feedback circuit 572. More specifically, the capacitor C1 of the smoothing circuit 560 is provided such that the distance between the electrode C1a and the resistor R3 of the first feedback circuit 570 is shorter than the distance between the electrode C1b and the resistor R3 of the first feedback circuit 570, and the capacitor C1 of the smoothing circuit 560 is provided such that the distance between the electrode C1a and the capacitor C2 of the second feedback circuit 572 is shorter than the distance between the electrode C1b and the capacitor C2 of the second feedback circuit 572.

As shown in FIG. 10, the resistor R3 is a circuit element corresponding to the input end of the first feedback circuit 570, and the capacitor C2 is a circuit element corresponding to the input end of the second feedback circuit 572. As shown in FIGS. 12 to 14, the distance between the electrode C1a, of a capacitor C1, electrically coupled to the wiring 584 through which a drive signal COMA fed back to the first feedback circuit 570 and the second feedback circuit 572 travels, and the resistor R3 corresponding to the input end of the first feedback circuit 570 and the capacitor C2 corresponding to the input end of the second feedback circuit 572 is shorter than the distance between the electrode C1b different from the electrode C1a of the capacitor C1, and the resistor R3 and the capacitor C2, so that it is possible to shorten the wiring path for feeding back the drive signal COMA as a feedback signal. This reduces the possibility that the noise is superimposed on the wiring path through which the drive signal COMA as the feedback signal travels. Therefore, the possibility that the accuracy of the modulation signal Ms generated by the modulation circuit 510 decreases is reduced, and as a result, the possibility that the waveform accuracy of the drive signal COMA output from the drive circuit 50-a decreases is reduced. That is, it is possible to improve the waveform accuracy of the drive signal COMA output from the drive circuit 50-a.

As described above, the drive signal COMA output from the smoothing circuit 560 is fed back to the first feedback circuit 570 and the second feedback circuit 572 via the via 52, the wiring 586, the via 53, and the wiring 585. That is, the drive signal COMA traveling through the via 52, the wiring 586, the via 53, and the wiring 585 corresponds to a feedback signal, and a configuration including the via 52, the wiring 586, the via 53, and the wiring 585 through which the feedback signal travels, the first feedback circuit 570 and the second feedback circuit 572 correspond to a feedback circuit. A configuration including the drive circuit 50-a and the substrate 51 on which the drive circuit 50-a is mounted is an example of a circuit board.

1.7 Functions and Effects

In the liquid ejection apparatus 1 and the circuit board on which the drive circuit 50-a is mounted according to the present embodiment configured as described above, the smoothing circuit 560 included in the drive circuit 50-a is located between the modulation circuit 510 and the amplifier circuit 550 on the substrate 51. In other words, the amplifier circuit 550 is located closer to the end of the substrate 51 than the modulation circuit 510 that generates the modulation signal Ms and the smoothing circuit 560 that generates the drive signal COMA. Thus, the possibility that the noise caused by a large current flowing due to the amplification operation of the drive circuit 50-a is superimposed on the modulation circuit 510 and the smoothing circuit 560 is reduced. Therefore, the waveform accuracy of the modulation signal Ms generated by the modulation circuit 510 is improved, and further, the accuracy of the amplified modulation signal obtained by amplifying the modulation signal Ms is also improved. The accuracy of the demodulation processing of the amplified modulation signal in the smoothing circuit 560 is also improved, and as a result, the waveform accuracy of the drive signal COMA output from the drive circuit 50-a is improved.

Further, the liquid ejection apparatus 1 and the circuit board on which the drive circuit 50-a is mounted according to the embodiment includes the capacitor Cb having one end electrically coupled to the terminal Hd of the amplifier circuit 550 and the other end electrically coupled to the terminal Ls of the amplifier circuit 550. This capacitor Cb functions as a bypass capacitor electrically coupled in parallel in the amplifier circuit 550. A large current generated by the switching operation of the amplifier circuit 550 flows through the capacitor Cb. For this reason, the noise due to the operation of the amplifier circuit 550 may be generated from the capacitor Cb. In the liquid ejection apparatus 1 and the circuit board on which the drive circuit 50-a is mounted according to the present embodiment, the amplifier circuit 550 is located between the smoothing circuit 560 and the capacitor Cb. That is, the capacitor Cb is also located closer to the end of the substrate 51 than the modulation circuit 510 that generates the modulation signal Ms and the smoothing circuit 560 that generates the drive signal COMA. This reduces the possibility that the noise caused by a large current flowing through the capacitor Cb due to the amplification operation of the drive circuit 50-a is superimposed on the modulation circuit 510 and the smoothing circuit 560. Therefore, the waveform accuracy of the modulation signal Ms generated by the modulation circuit 510 is further improved, and the accuracy of the amplified modulation signal obtained by amplifying the modulation signal Ms is further improved. The accuracy of the demodulation process of the amplified modulation signal in the smoothing circuit 560 is further improved, and as a result, the waveform accuracy of the drive signal COMA output from the drive circuit 50-a is further improved.

2. Second Embodiment

The liquid ejection apparatus 1 according to the second embodiment is different from the liquid ejection apparatus 1 according to the first embodiment in that the transistor M1 and the transistor M2 included in the amplifier circuit 550 of the drive circuit 50-a mounted on the substrate 51 are housed in one housing 561. In the description of the liquid ejection apparatus 1 according to the second embodiment, the same components as those of the liquid ejection apparatus 1 according to the first embodiment are denoted by the same reference numerals, and the detailed description thereof will be omitted or simplified.

Figure 15:
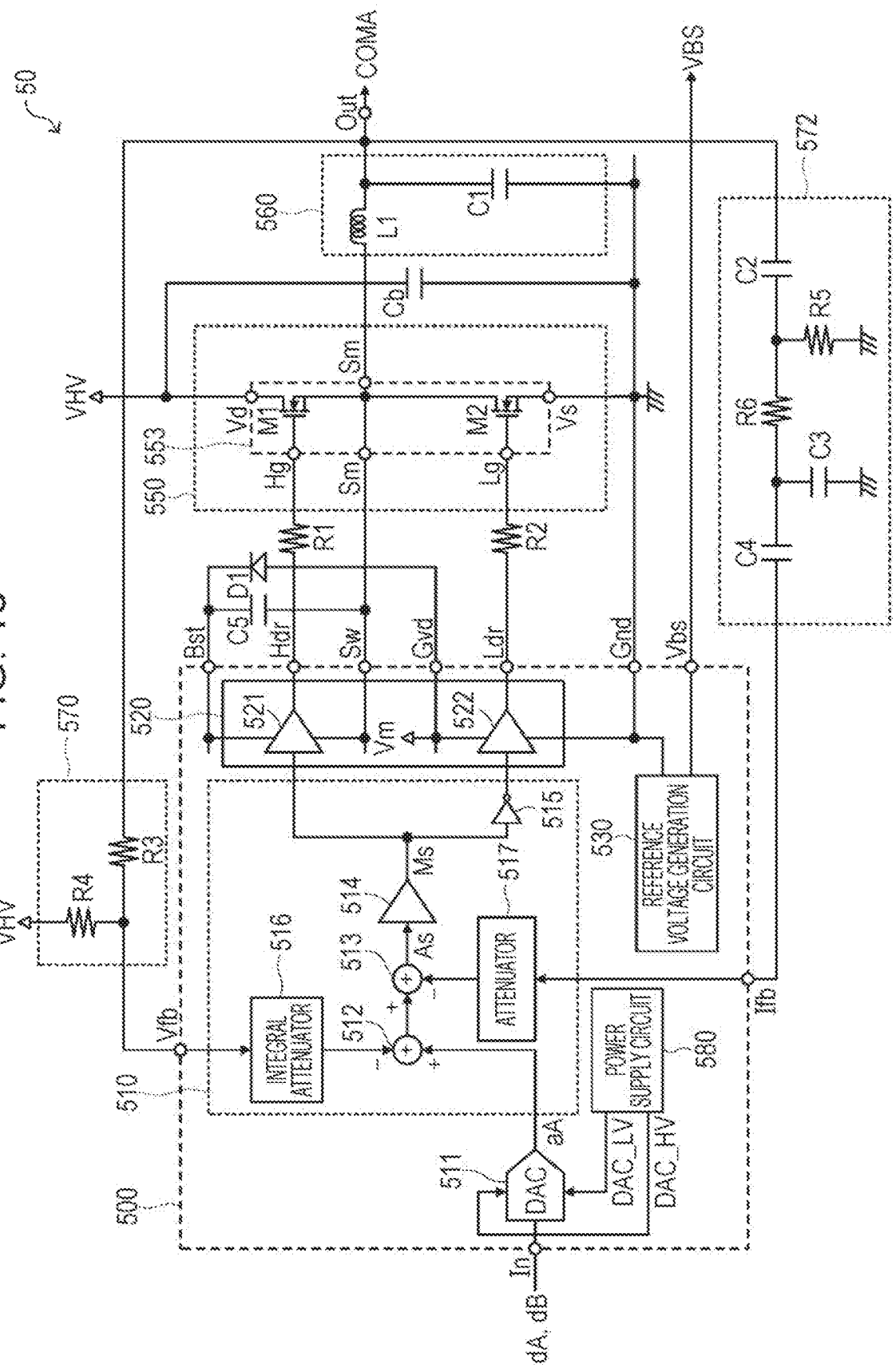
FIG. 15 is a diagram illustrating a configuration of a drive circuit included in a liquid ejection apparatus according to a second embodiment.

FIG. 15 is a diagram illustrating a configuration of the drive circuit 50-a included in the liquid ejection apparatus 1 according to the second embodiment. Note that, as in the first embodiment, the drive circuits 50-a and 50-b have the same configuration, and the detailed description of the drive circuit 50-b will be omitted.

As shown in FIG. 15, the amplifier circuit 550 includes the transistors M1 and M2 housed in the housing 561.

The drain of the transistor M1 is electrically coupled to a terminal Vd of the housing 561. The voltage VHV, which is a DC voltage of 42 V, for example, is supplied to the drain of the transistor M1 via the terminal Vd. The gate of the transistor M1 is electrically coupled to the terminal Hg of the housing 561. Further, the terminal Hg of the housing 561 is electrically coupled to one end of the resistor R1, and the other end of the resistor R1 is electrically coupled to the terminal Hdr of the integrated circuit 500. That is, the first amplification control signal output from the terminal Hdr of the integrated circuit 500 is supplied to the gate of the transistor M1. The source of the transistor M1 is electrically coupled to two terminals Sm of the housing 561. In addition, at least one of the terminals Sm of the housing 561 is electrically coupled to the terminal Sw of the integrated circuit 500.

The drain of the transistor M2 is electrically coupled to the two terminals Sm of the housing 561. In addition, at least one of the terminals Sm of the housing 561 is electrically coupled to the terminal Sw of the integrated circuit 500. That is, the drain of the transistor M2 and the source of the transistor M1 are electrically coupled to each other inside the housing 561, and are electrically coupled to the terminal Sw of the integrated circuit 500 via the terminal Sm. The gate of the transistor M2 is electrically coupled to the terminal Lg of the housing 561. The terminal Lg of the housing 552 is electrically coupled to one end of a resistor R2, and the other end of the resistor R2 is electrically coupled to the terminal Ldr of the integrated circuit 500.

That is, the second amplification control signal output from the terminal Ldr of the integrated circuit 500 is supplied to the gate of the transistor M2. The source of the transistor M2 is electrically coupled to a terminal Vs of the housing 561. The ground potential is supplied to the source of the transistor M2 via the terminal Ls of the housing 561.

In the amplifier circuit 550 configured as described above, when the transistor M1 is turned off and the transistor M2 is turned on, the voltage of the node to which the terminal Sw is coupled is the ground potential. Therefore, the voltage Vm is supplied to the terminal Bst. On the other hand, when the transistor M1 is turned on and the transistor M2 is turned off, the voltage of the node to which the terminal Sw is coupled is the voltage VHV. Therefore, a voltage signal of the potential of the voltage VHV+Vm is supplied to the terminal Bst.

That is, the gate driver 521 that drives the transistor M1 uses the capacitor C5 as a floating power supply, and when the potential of the terminal Sw changes to 0 V or the voltage VHV according to the operation of the transistor M1 and the transistor M2, the gate driver 521 supplies, to the gate of the transistor M1, the first amplification control signal whose L level is the potential of the voltage VHV and whose H level is the potential of the voltage VHV+the voltage Vm.

On the other hand, the gate driver 522 that drives the transistor M2 supplies, to the gate of the transistor M2, the second amplification control signal whose L level is the ground potential and whose H level is the potential of the voltage Vm irrespective of the operation of the transistor M1 and the transistor M2.

As mentioned above, the amplifier circuit 550 includes the transistor M1 electrically coupled to the terminal Vd to which the voltage VHV is input as a power supply voltage, and the transistor M2 electrically coupled to the terminal Vs to which the ground potential is input as a reference voltage. When the modulation signal Ms obtained by modulating the original drive signals dA and aA is by amplified by the transistor M1 and the transistor M2, an amplified modulation signal is generated at the terminals Sm to which the source of the transistor M1 and the drain of the transistor M2 are coupled in common. The generated amplified modulation signal is input to the smoothing circuit 560 via the terminal Sm. Here, the terminal Vd is an example of a first input terminal of the amplifier circuit 550 in the second embodiment, and the terminal Ls is an example of a second input terminal of the amplifier circuit 550 in the second embodiment. Further, the transistor M1 is an example of a first transistor in the second embodiment, and the transistor M2 is an example of a second transistor in the second embodiment. The housing 561 that houses the transistor M1 and the transistor M2 is an example of a third housing.

A capacitor Cb functioning as a bypass capacitor is coupled to both ends of the amplifier circuit 550. Specifically, one end of the capacitor Cb is coupled to the terminal Vd, of the housing, 561 to which the drain of the transistor M1 is coupled, and the other end of the capacitor Cb is coupled to a terminal Vs, of the housing 561 to which the source of the transistor M2 is coupled. Thus, the fluctuation of the potential of the voltage VHV caused by the operation of the amplifier circuit 550 is reduced, and as a result, the fluctuation of the maximum voltage value of the amplified modulation signal output from the amplifier circuit 550 is reduced. This capacitor Cb is an example of a capacitive element.

Figure 16:
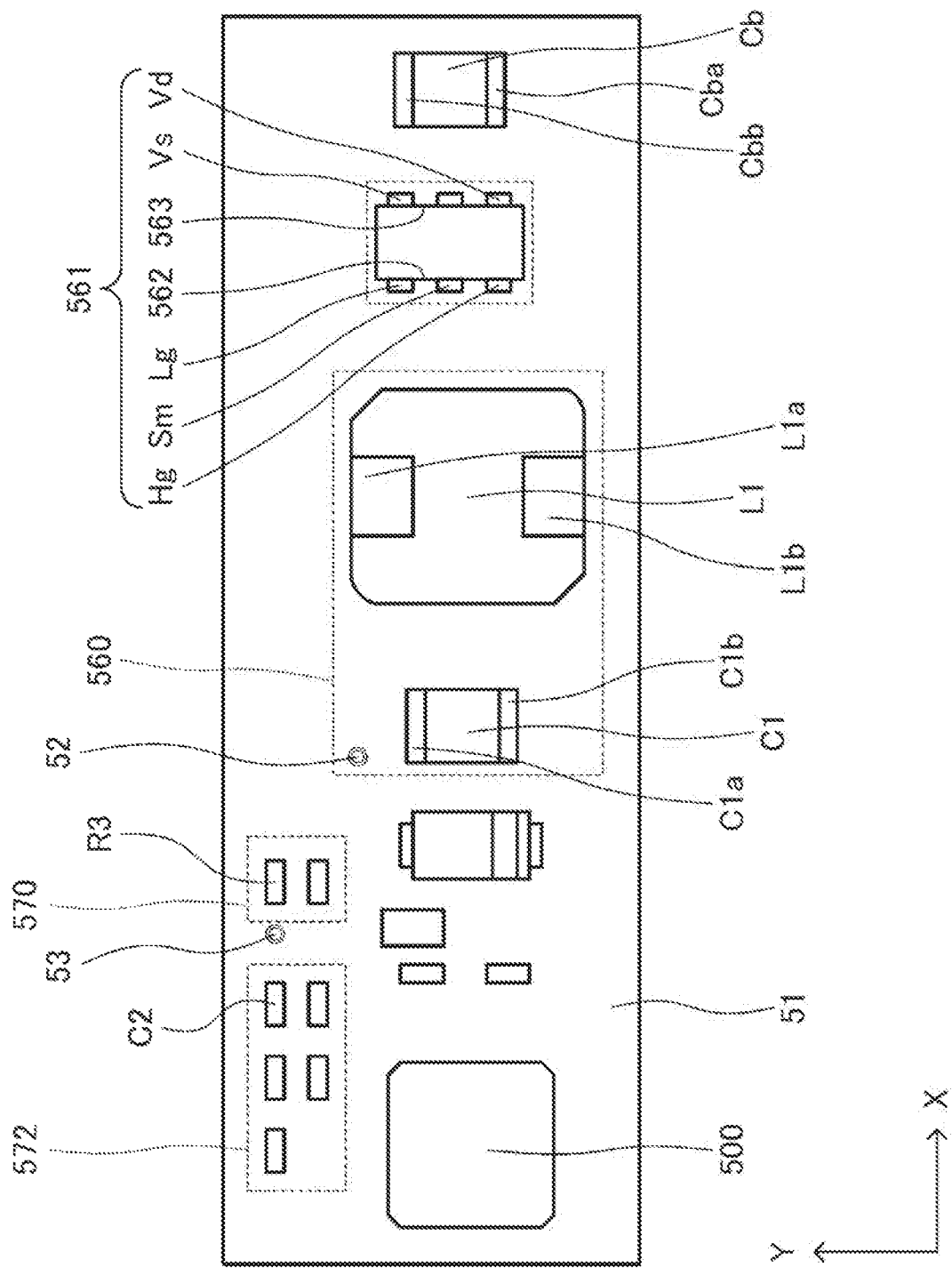
FIG. 16 is a diagram illustrating the arrangement of respective circuits included in a drive circuit on a substrate according to the second embodiment.
Figure 17:
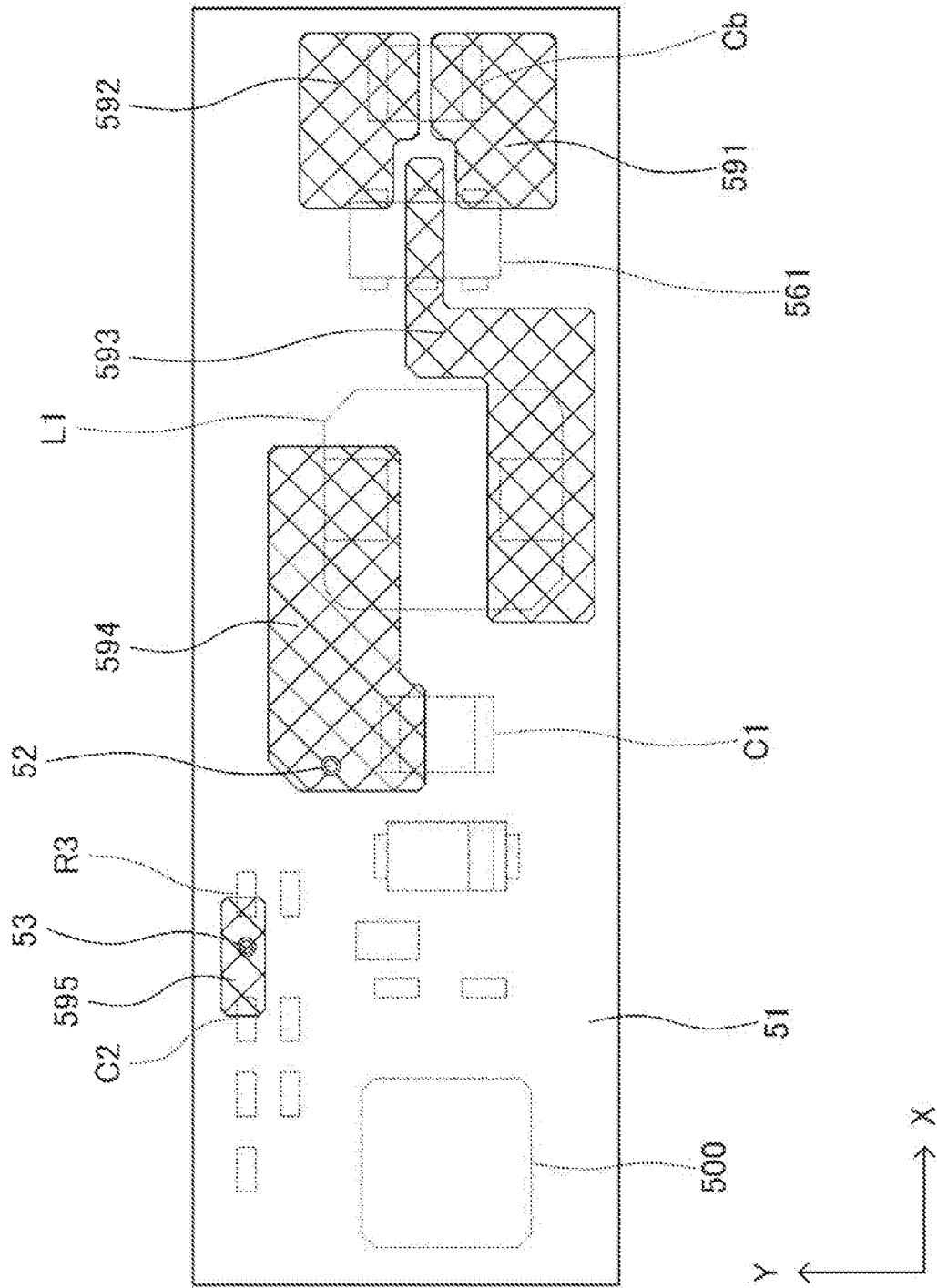
FIG. 17 is a diagram illustrating an example of wiring that electrically couples respective circuits included in the drive circuit according to the second embodiment.
Figure 18:
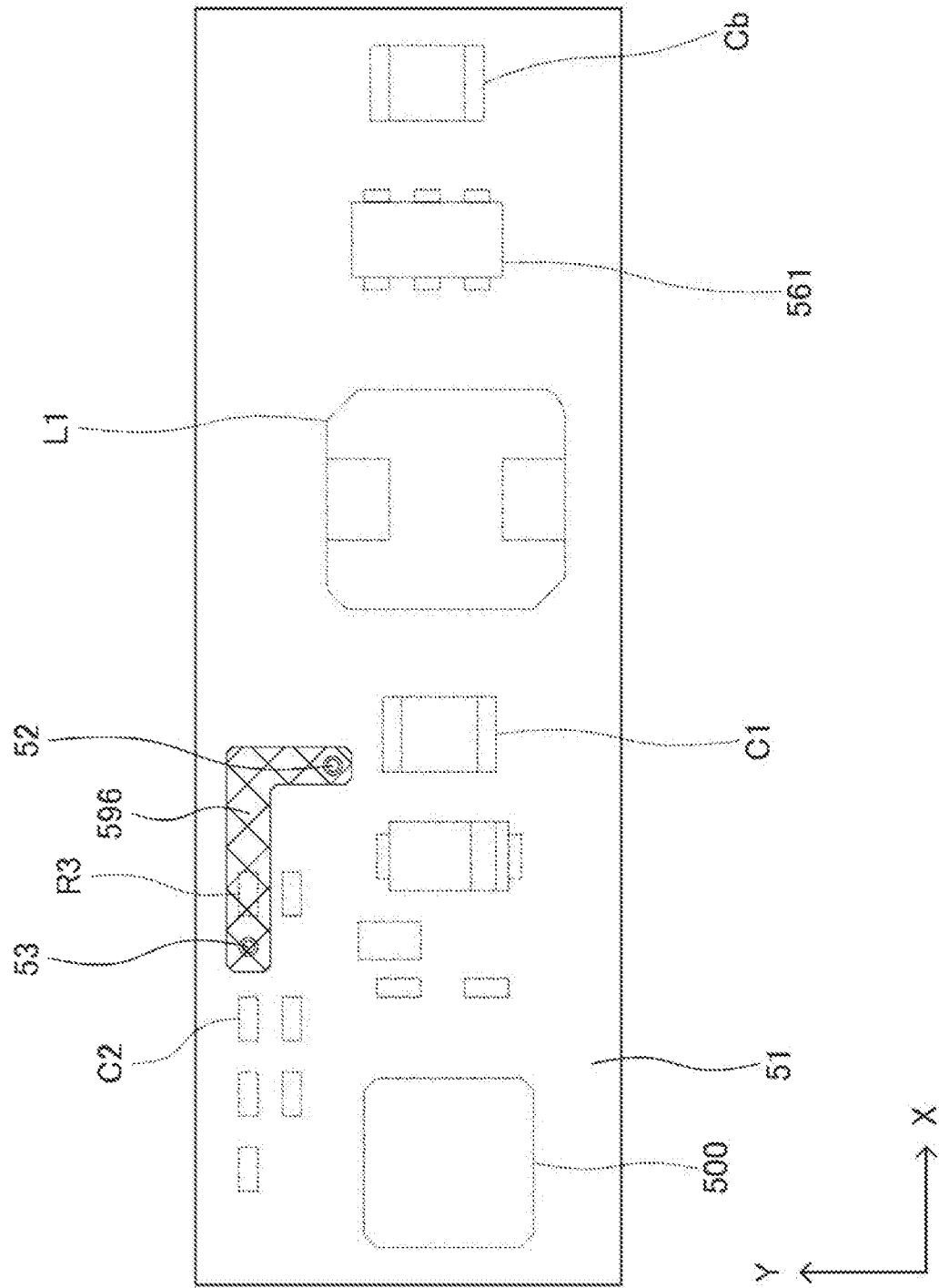
FIG. 18 is a diagram illustrating an example of wiring that electrically couples respective circuits included in a drive circuit provided in a wiring layer different from that of FIG. 17 on the substrate according to the second embodiment.

Next, the arrangement of respective circuits included in the drive circuit 50-a on the substrate 51 of the second embodiment will be described with reference to FIGS. 16 to 18. FIG. 16 is a diagram illustrating the arrangement, on the substrate 51, of respective circuits included in the drive circuit 50-a according to the second embodiment. FIG. 17 is a diagram illustrating an example of wiring that electrically couples respective circuits included in the drive circuit 50-a according to the second embodiment. FIG. 18 is a diagram illustrating an example of wiring that electrically couples respective circuits included in the drive circuit 50-a included in the wiring layer different from that of FIG. 17 on the substrate 51 according to the second embodiment. In the following description, as shown in FIGS. 16 to 18, the description will be made using the X direction and the Y direction that are orthogonal to each other. As in the first embodiment, the substrate 51 has a substantially rectangular shape including a pair of short sides that faces each other in the X direction and a pair of long sides that faces each other in the Y direction, and the description will be made on the assumption that the substrate 51 is a multilayer substrate having a plurality of the wiring layers. Further, FIGS. 16 to 18 show only the drive circuit 50-a is mounted on the substrate 51, but a plurality of drive circuits including the drive circuit 50-b may be mounted on the substrate 51.

As shown in FIG. 16, for the substrate 51, the integrated circuit 500 including the modulation circuit 510, the amplifier circuit 550, the smoothing circuit 560, and the capacitor Cb are provided on the same surface of the substrate 51 in order of the integrated circuit 500, the smoothing circuit 560, the amplifier circuit 550, and the capacitor Cb along the X direction. In other words, the amplifier circuit 550 including the housing 561 including the terminal Vd and the terminal Vs, and the capacitor Cb are provided on the same surface of the substrate 51. On the substrate 51, the smoothing circuit 560 is located between the integrated circuit 500 including the modulation circuit 510 and the amplifier circuit 550, and the amplifier circuit 550 is located between the smoothing circuit 560 and the capacitor Cb.

As mentioned above, the possibility that the switching noise generated in the amplifier circuit 550 is superimposed on the modulation circuit 510 is reduced by providing the amplifier circuit 550 that performs the switching operation at a position away from the integrated circuit 500 including the modulation circuit 510 in the drive circuit 50-a. As a result, as in the first embodiment, the accuracy of the drive signal COMA generated based on the modulation signal Ms is improved.

The housing 561 that houses the transistors M1 and M2 included in the amplifier circuit 550 includes a side 563 on which the terminals Vd and Vs are provided, and a side 562 that faces the side 563 in the X direction. The housing 561 is mounted on the substrate 51 such that the distance between the side 563 and the capacitor Cb is shorter than the distance between the side 562 and the capacitor Cb. In other words, the terminal Vd electrically coupled to the drain of the transistor M1 is located on a side, of the housing 561, toward the capacitor Cb that functions as a bypass capacitor, and the terminal Vs electrically coupled to the source of the transistor M2 is located on a side, of the housing 561, toward the capacitor Cb that functions as a bypass capacitor. Here, the side 563 of the housing 561 is an example of a fifth side, and the side 562 is an example of a sixth side.

The liquid ejection apparatus 1 according to the second embodiment configured as described above can achieve the same functions and effects as the first embodiment.

Although the embodiments and the modifications have been described above, the present disclosure is not limited to the embodiments and the modifications, and can be implemented in various modes without departing from the gist of the disclosure. For example, the above embodiments can be appropriately combined.

The disclosure includes a configuration substantially same as the configuration described in the embodiments (for example, a configuration having the same function, method, and result, or a configuration having the same object and effect). Further, the disclosure includes a configuration in which a non-essential part of the configuration described in the embodiments is replaced. Further, the disclosure includes a configuration having the same functions and effects as the configuration described in the embodiments or a configuration capable of achieving the same object. The disclosure also includes a configuration in which a known technique is added to the configuration described in the embodiments.

What is claimed is:

1. A liquid ejection apparatus comprising:
a liquid ejection head including a drive element, the liquid ejection head ejecting a liquid by driving the drive element;
a drive signal output circuit that outputs a drive signal for driving the drive element; and
a substrate provided with the drive signal output circuit, wherein
the drive signal output circuit includes
a modulation circuit that modulates an original drive signal to output a modulation signal,
an amplifier circuit that amplifies the modulation signal to output an amplified modulation signal, and
a demodulation circuit that demodulates the amplified modulation signal to output the drive signal for driving the drive element, and wherein
the demodulation circuit is located, on the substrate, between the modulation circuit and the amplifier circuit.

2. The liquid ejection apparatus according to claim 1, wherein
the amplifier circuit includes a first input terminal to which a power supply voltage is input, and a second input terminal to which a reference voltage is input, wherein
the drive signal output circuit includes a capacitive element having one end electrically coupled to the first input terminal and the other end electrically coupled to the second input terminal, and wherein
the amplifier circuit is located between the demodulation circuit and the capacitive element.

3. The liquid ejection apparatus according to claim 2, wherein
the first input terminal, the second input terminal, and the capacitive element are provided on a same surface of the substrate, wherein
the first input terminal and the one end of the capacitive element are electrically coupled to each other through first wiring provided on the surface, and wherein
the second input terminal and the other end of the capacitive element are electrically coupled to each other through second wiring provided on the surface.

4. The liquid ejection apparatus according to claim 2, wherein
the amplifier circuit includes a first transistor electrically coupled to the first input terminal and a second transistor electrically coupled to the second input terminal.

5. The liquid ejection apparatus according to claim 4, wherein
the first transistor is housed in a first housing having a first side provided with the first input terminal and a second side facing the first side, and wherein
a distance between the first side and the capacitive element is shorter than a distance between the second side and the capacitive element.

6. The liquid ejection apparatus according to claim 4, wherein
the second transistor is housed in a second housing including a third side provided with the second input terminal and a fourth side facing the third side, and wherein
a distance between the third side and the capacitive element is shorter than a distance between the fourth side and the capacitive element.

7. The liquid ejection apparatus according to claim 4, wherein
the first transistor and the second transistor are housed in a third housing including a fifth side provided with the first input terminal and the second input terminal and a sixth side facing the fifth side, and wherein
a distance between the fifth side and the capacitive element is shorter than a distance between the sixth side and the capacitive element.

8. A circuit board comprising:
a modulation circuit that modulates an original drive signal to output a modulation signal;
an amplifier circuit that amplifies the modulation signal to output an amplified modulation signal;
a demodulation circuit that demodulates the amplified modulation signal to outputs a drive signal for driving a drive element; and
a substrate provided with the modulation circuit, the amplifier circuit, and the demodulation circuit, wherein
the demodulation circuit is located, on the substrate, between the modulation circuit and the amplifier circuit.

* * * * *